(12) United States Patent
Choi et al.

(10) Patent No.: US 11,907,005 B2
(45) Date of Patent: Feb. 20, 2024

(54) CLOCK MANAGEMENT CIRCUIT AND MULTI-CORE SYSTEM INCLUDING THE SAME

(71) Applicant: Samsung Electronics Co., Ltd., Suwon-si (KR)

(72) Inventors: Geunho Choi, Hwaseong-si (KR); Mingoo Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 137 days.

(21) Appl. No.: 17/552,454

(22) Filed: Dec. 16, 2021

(65) Prior Publication Data

US 2022/0342439 A1 Oct. 27, 2022

(30) Foreign Application Priority Data

Apr. 21, 2021 (KR) .................. 10-2021-0051573

(51) Int. Cl.
*G06F 1/08* (2006.01)
*H03K 19/20* (2006.01)
*G06F 1/10* (2006.01)

(52) U.S. Cl.
CPC .............. *G06F 1/08* (2013.01); *G06F 1/10* (2013.01); *H03K 19/20* (2013.01)

(58) Field of Classification Search
CPC ...... H03K 5/135; H03K 19/20; G11C 29/023; G06F 1/08; G06F 1/10; G06F 1/3243; G06F 1/3237; G06F 1/324; G06F 15/80; G06F 1/12; G06F 1/3296; G06F 1/3287; G06F 1/06; G06F 1/04; G06F 1/329; G06F 1/14; G06F 1/3275; G06F 1/3234; G06F 9/3869; G06F 1/3203; G06F 1/3253; G06F 13/1689; G06F 1/3293; G06F 1/3206; G06F 1/24; Y02D 10/00
See application file for complete search history.

(56) References Cited

U.S. PATENT DOCUMENTS 5,802,132 A * 9/1998 Pathikonda ............... G06F 1/12
327/144
7,053,686 B2 5/2006 Lee
(Continued)

FOREIGN PATENT DOCUMENTS

JP 5406287 B2 12/2010
KR 1020050064036 A 6/2005
KR 1020100059994 A 6/2010

*Primary Examiner* — John W Poos
(74) *Attorney, Agent, or Firm* — Muir Patent Law, PLLC

(57) ABSTRACT

A multi-core system includes a multi-core processor, a function block, a clock management circuit, and a control circuit. The multi-core processor includes a plurality of processor cores configured to operate based on a plurality of core clock signals, respectively. The function block communicates with the multi-core processor based on an interface clock signal. The clock management circuit generates each of the plurality of core clock signals by selecting one of a first clock signal having a first frequency and a second clock signal having a second frequency different from the first frequency based on each of a plurality of frequency selection signals. The clock management circuit generates the interface clock signal based on the second clock signal. A control circuit may generate the plurality of frequency selection signals corresponding to the plurality of processor cores, respectively.

19 Claims, 31 Drawing Sheets

(56) References Cited

U.S. PATENT DOCUMENTS

| | | |
|---|---|---|
| 8,347,127 B2 | 1/2013 | Zagacki |
| 9,009,513 B2 | 4/2015 | Yamamoto et al. |
| 9,032,407 B2 | 5/2015 | Saito |
| 9,429,981 B2 | 8/2016 | Persson |
| 10,156,882 B2 | 12/2018 | Campisano et al. |
| 2015/0033062 A1* | 1/2015 | Tsao ................. G06F 1/324 |
| | | 711/163 |
| 2019/0050020 A1 | 2/2019 | Chu |
| 2019/0384348 A1* | 12/2019 | Srinivasan ........... G06F 1/3203 |
| 2021/0157381 A1* | 5/2021 | Goffman-Vinopal ................. |
| | | G06F 1/324 |

* cited by examiner

FIG. 22
310
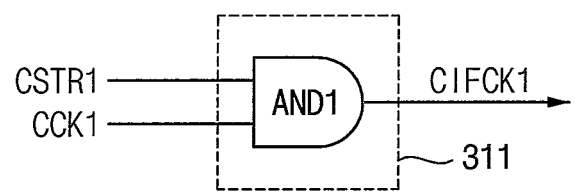
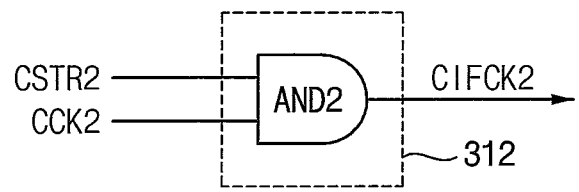
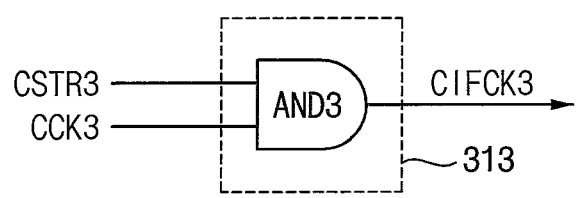

CLOCK MANAGEMENT CIRCUIT AND MULTI-CORE SYSTEM INCLUDING THE SAME

CROSS-REFERENCE TO RELATED APPLICATION(S)

This U.S. non-provisional application claims priority under 35 USC § 119 to Korean Patent Application No. 10-2021-0051573, filed on Apr. 21, 2021, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a clock management circuit and a multi-core system including the clock management circuit.

2. Discussion of the Related Art

A multi-core processor may include a plurality of processor cores to enhance performance of computing devices. The plurality of processor cores in the multi-core processor may be grouped into one or more clock domains. In general, the processor cores included in the same clock domain may operate based on the same clock signal. A frequency of the clock signal and an operation voltage provided to each clock domain may be adjusted through a dynamic voltage and frequency scaling (DVFS) scheme for optimization of performance and power consumption. When the processor cores in the same clock domain operate based on the same frequency, the optimization of performance and the power consumption may be limited.

SUMMARY

Some example embodiments may provide a clock management circuit and a multi-core system including the clock management circuit capable of efficiently controlling frequencies of a plurality of processor cores.

According to example embodiments, a multi-core system includes a multi-core processor, a function block, a clock management circuit, and a control circuit. The multi-core processor includes a plurality of processor cores configured to operate based on a plurality of core clock signals, respectively. The function block communicates with the multi-core processor based on an interface clock signal. The clock management circuit generates each of the plurality of core clock signals by selecting one of a first clock signal having a first frequency and a second clock signal having a second frequency different from the first frequency based on each of a plurality of frequency selection signals. The clock management circuit generates the interface clock signal based on the second clock signal. The control circuit generates the plurality of frequency selection signals corresponding to the plurality of processor cores, respectively.

According to example embodiments, a multi-core system includes a multi-core processor, a function block and a clock management circuit. The multi-core processor includes a first processor core configured to operate based on a first core clock signal and a second processor core configured to operate based on a second core clock signal. The function block communicates with the multi-core processor based on an interface clock signal. The clock management circuit generates the first core clock signal by selecting one of a first clock signal having a first frequency and a second clock signal having a second frequency different from the first frequency based on a first frequency selection signal, generates the second core clock signal by selecting one of the first clock signal and the second clock signal based on a second frequency selection signal, and generates the interface clock signal based on the second clock signal. The clock management circuit simultaneously deactivates the first core clock signal, the second core clock signal and the interface clock signal in a clock gating period when at least one of a frequency of the first core clock signal and a frequency of the second core clock signal is changed.

According to example embodiments, a clock management circuit includes a synchronization circuit configured to generate a clock gating signal that is activated to control a clock gating period when a frequency of at least one of a plurality of core clock signals provided to a plurality of processor cores of a multi-core system is changed, a plurality of clock switching circuits configured to a plurality of switching clock signals by selecting one of the first clock signal having a first frequency and the second clock signal having a second frequency different from the first frequency, a plurality of core clock gating circuits configured to generate the plurality of core clock signals respectively corresponding to the plurality of switching clock signals by deactivating the plurality of switching clock signals in the clock gating period based on the clock gating signal, and an interface clock gating circuit configured to generate an interface clock signal provided to a function block of the multi-core system by deactivating the second clock signal in the clock gating period based on the clock gating signal.

The clock management circuit and the multi-core system including the clock management circuit according to example embodiments may efficiently optimize performance and power consumption of the multi-core processor by independently changing the operation frequency per processor core.

In addition, the clock management circuit and the multi-core system including the clock management circuit according to example embodiments may efficiently synchronize communication between processor cores and the function block by generating the plurality of core clock signals and the interface clock signal using the first clock signal and the second clock signal having different frequencies.

In addition, the clock management circuit and the multi-core system including the clock management circuit according to example embodiments may reduce or prevent operation errors due to clock change, by simultaneously deactivating the plurality of core clock signals and the interface clock signals in the clock gating period.

BRIEF DESCRIPTION OF THE DRAWINGS

Example embodiments of the present disclosure will be more clearly understood from the following detailed description taken in conjunction with the accompanying drawings.

FIG. 22 is a diagram illustrating a core interface control circuit included in a multi-core processor in FIG. 1 according to example embodiments.

DETAILED DESCRIPTION OF THE EMBODIMENTS

Figure 1:
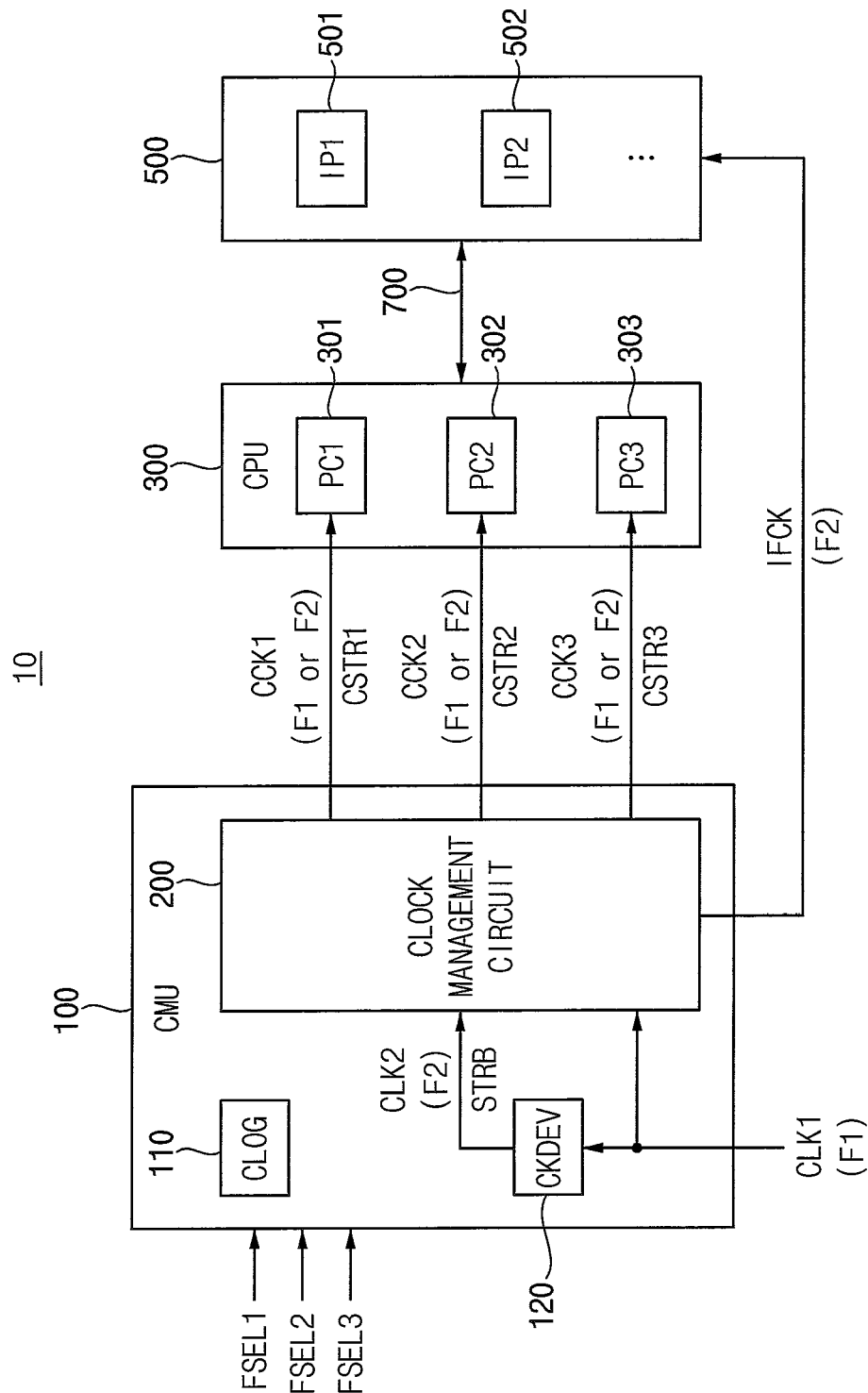
FIG. 1 is a block diagram illustrating a multi-core system according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a block diagram illustrating a multi-core system according to example embodiments.

Referring to FIG. 1, a multi-core system 10 may include a clock management unit CMU 100, a multi-core processor or CPU 300 and an internal circuit 500.

The multi-core processor 300 may include a plurality of processor cores configured to operate based on a plurality of core clock signals, respectively. FIG. 1 illustrates three processor cores for convenience of illustration and description, but example embodiments are not limited thereto. According to example embodiments, the multi-core processor 300 may include two, four or more processor cores.

For example, the multi-core processor 300 may include a first processor core PC1 301, a second processor core PC2 302 and a third processor core PC3 303. The first processor core 301 may operate based on a first core clock signal CCK1, the second processor core 302 may operate based on a second core clock signal CCK2 and the third processor core 303 may operate based on a third core clock signal CCK3.

The internal circuit 500 may include one or more intellectual property (IP) blocks or function blocks IP1 and IP2 501 and 502. The function blocks 501 and 502 may be connected to the multi-core processor 300 through an interface 700 and communicate with the multi-core processor 300 based on an interface clock signal IFCK. For example, the multi-core processor 300 may transmit or receive data, a control signal and/or a command signal to or from the internal circuit 500 through the interface 700.

The clock management unit 100 may include a control logic CLOG 110, a clock divider CKDEV 120 and a clock management circuit 200. In some example embodiments, the clock divider 120 may be disposed outside the clock management unit 100.

The control logic 110 may control overall operations of the clock management unit 100. The control logic 110 may generate control signals to control operations and operation timings of the clock management circuit 200 based on a plurality of frequency selection signals.

The clock divider 120 may divide a first clock signal CLK1 having a first frequency F1 to generate a second clock signal CLK2 having a second frequency F2 and provide the second clock signal CLK2 to the clock management circuit 200. As will be described below with reference to FIG. 4, the first clock signal CLK1 and the second clock signal CLK2 may be provided commonly to a plurality of clock switching circuits and an interface clock gating circuit included in the clock management circuit 200. The division ratio of the clock divider 120 may be fixed with a value stored in the clock divider 120 or may be varied based on a control signal from the control logic 110.

The clock management circuit 200 may generate each of the plurality of core clock signals by selecting one of the first clock signal CLK1 and the second clock signal CLK2 based on each of the plurality of frequency selection signals. In addition, the clock management circuit 200 may generate the interface clock signal IFCK based on the second clock signal CLK2.

For example, the plurality of frequency selection signals may include a first frequency selection signal FSEL1 corresponding the first processor core 301, a second frequency selection signal FSEL2 corresponding to the second processor core 302 and a third frequency selection signal FSEL3 corresponding to the third processor core 303.

The clock management circuit 200 may generate the first core clock signal CCK1 provided to the first processor core 301 by selecting one of the first clock signal CLK1 and the second clock signal CLK2 based on the first frequency selection signal FSEL1, generate the second core clock signal CCK2 provided to the second processor core 302 by selecting one of the first clock signal CLK1 and the second clock signal CLK2 based on the second frequency selection signal FSEL2, and generate the third core clock signal CCK3 provided to the third processor core 303 by selecting one of the first clock signal CLK1 and the second clock signal CLK2 based on the third frequency selection signal FSEL3. For example, a control circuit (not shown) included in the multi-core system 10 may generate the plurality of frequency selection signals FSEL1~FSEL3.

For example, the first core clock signal CCK1 may have the first frequency F1 or the second frequency F2 depending on the first frequency selection signal FSEL1, the second core clock signal CCK2 may have the first frequency F1 or the second frequency F2 depending on the second frequency selection signal FSEL2, and the third core clock signal CCK3 may have the first frequency F1 or the second frequency F2 depending on the third frequency selection signal FSEL3.

The clock management circuit 200 may change a frequency of each of the plurality of core clock signals CCK1~CCK3 between the first frequency F1 and the second frequency F2 based on each of the plurality of frequency selection signals FSEL1~FSEL3. In addition, the clock management circuit 200 may fix a frequency of the interface clock signal IFCK to the second frequency F2 regardless of the plurality of frequency selection signals FSEL1~FSEL3.

As such, the clock management circuit 200 and the multi-core system 10 including the clock management circuit 200 according to example embodiments may efficiently optimize performance and power consumption of the multi-core processor 300 by independently changing the operation frequency per processor core.

The clock divider 120 may generate a strobe signal STRB having the second frequency F2 in addition to the second clock signal CLK2. The strobe signal STRB will be described with reference to FIG. 18.

The clock management circuit 200 may generate a plurality of core strobe signals CSTR1~CSTR3 corresponding to the plurality of core clock signals CCK1~CCK3 based on the plurality of frequency selection signals FSEL1~FSEL3. Each of the plurality of processor cores 301~303 may communicate with the function blocks 501 and 502 by the second frequency F2 based on each of the plurality of core clock signals CCK1~CCK3 and each of the plurality of core strobe signals CSTR1~CSTR3.

For example, the clock management circuit 200 may generate a first core strobe signal CSTR1 corresponding to the first core clock signal CCK1, a second core strobe signal CSTR2 corresponding to the second core clock signal CCK2 and a third core strobe signal CSTR3 corresponding to the third core clock signal CCK3.

The first processor core 301 may communicate with the function blocks 501 and 502 by the second frequency F2 based on the first core clock signal CCK1 and the first core strobe signal CSTR1. The second processor core 302 may communicate with the function blocks 501 and 502 by the second frequency F2 based on the second core clock signal CCK2 and the second core strobe signal CSTR2. The third processor core 303 may communicate with the function blocks 501 and 502 by the second frequency F2 based on the third core clock signal CCK3 and the third core strobe signal CSTR3.

The function blocks 501 and 502 may communicate with the plurality of processor cores 301~303 by the second frequency F2 based on the interface clock signal IFCK.

As such, the multi-core system 10 including the control logic 110, the clock divider 120 and the clock management circuit 200 according to example embodiments may efficiently synchronize communication between the plurality of processor cores 301~303 and the communication between the plurality of processor cores 301~303 and the function blocks 501 and 502 by generating the plurality of core clock signals CCK1~CCK3 and the interface clock signal IFCK using the first clock signal CLK1 and the second clock signal CLK2 having different frequencies.

Figure 2:
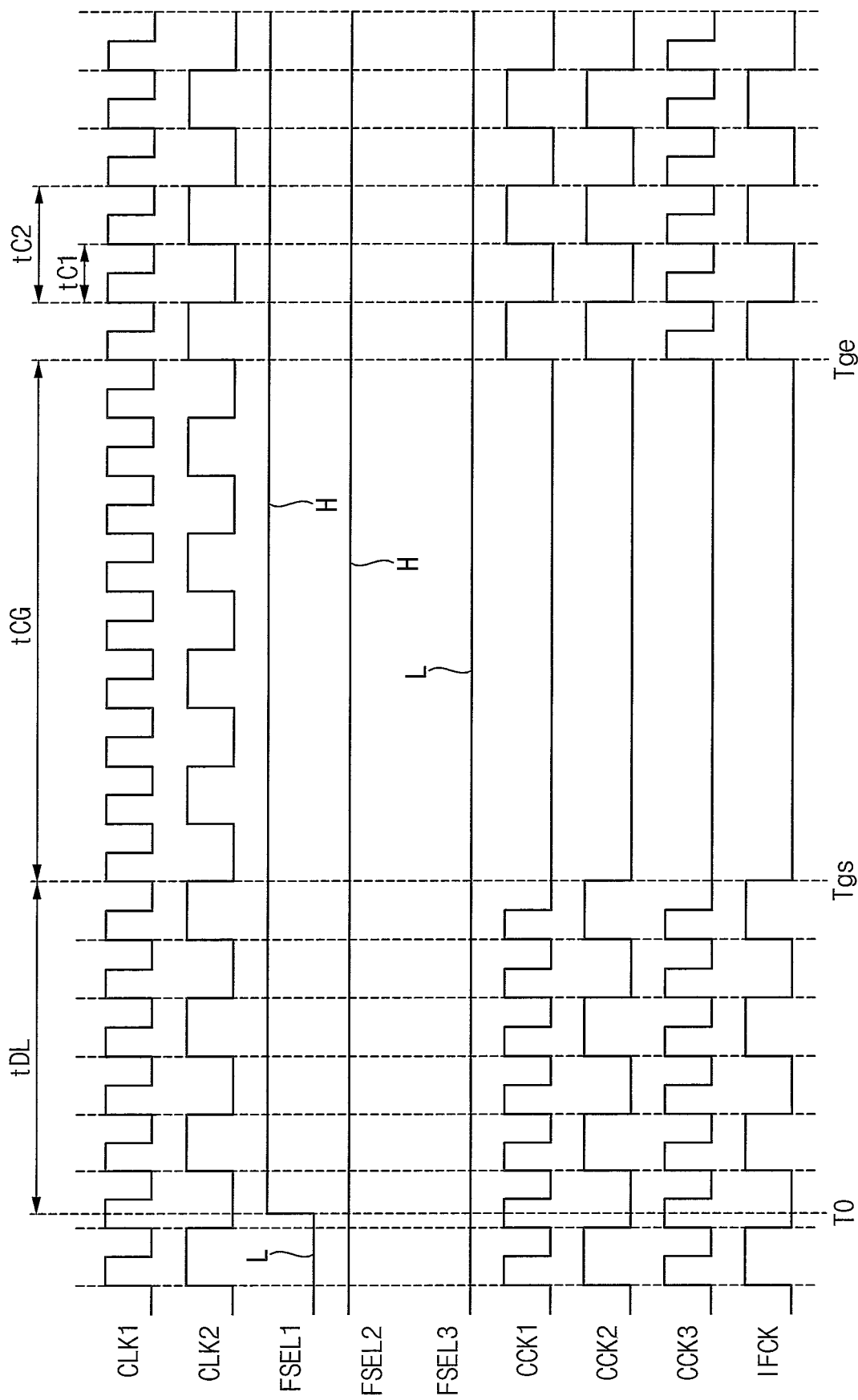
FIGS. 2 and 3 are timing diagrams illustrating a method of controlling a frequency of a multi-core system according to example embodiments.
Figure 3:
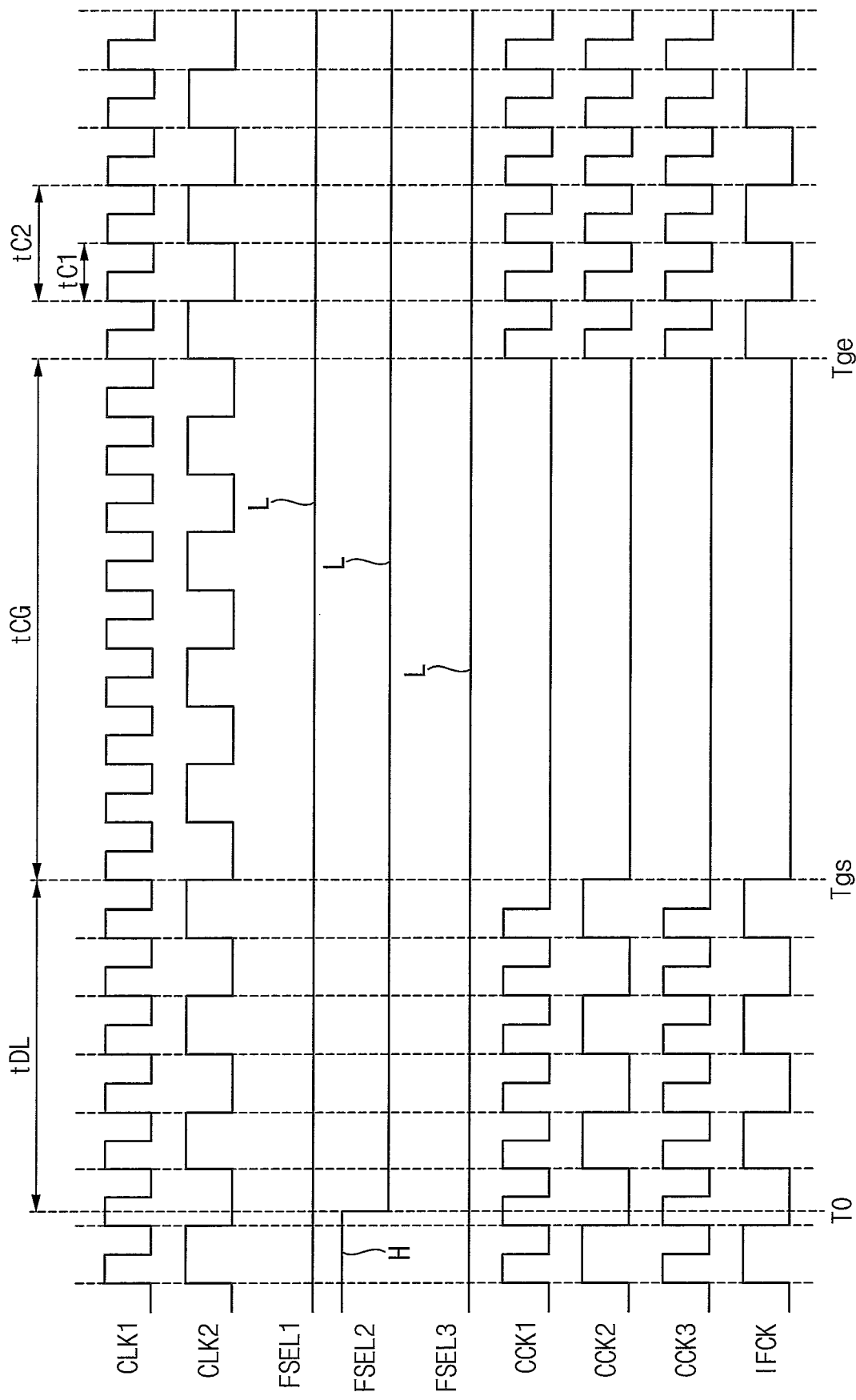

FIGS. 2 and 3 are timing diagrams illustrating a method of controlling a frequency of a multi-core system according to example embodiments.

Referring to FIGS. 2 and 3, the cyclic period tC1 of the first clock signal CLK1 may be half the cyclic period tC2 of the second clock signal CLK2. In other words, the second frequency F2 of the second clock signal CLK2 may be half the first frequency F1 of the first clock signal CLK1, and the division ratio of the clock divider 120 in FIG. 1 may be ½. Example embodiments are described based on the division ratio of ½ in this disclosure, but the division ratio of the clock divider 120 may be determined variously such as ½, ⅓, ¼ and so on.

The logic level of the frequency selection signals FSEL1~FSEL3 may indicate the operation frequency of the corresponding processor core. For example, the logic low level L of the frequency selection signals FSEL1~FSEL3 may indicate that the operation frequency of the corresponding processor core is the first frequency F1 and the logic high level H of the frequency selection signals FSEL1~FSEL3 may indicate that the operation frequency of the corresponding processor core is the second frequency F2, but example embodiments are not limited to thereto.

FIG. 2 illustrates a case that the frequency of the first core clock signal CCK1 is changed from the first frequency F1 to the second frequency F2.

The first frequency selection signal FSEL1 may transition from the logic low level L to the logic high level H at a time point T0 to indicate that the frequency of the first core clock signal CCK1 is changed from the first frequency F1 to the second frequency F2. The second frequency selection signal FSEL2 may maintain the logic high level H such that the second core clock signal CCK2 may maintain the second frequency F2, and the third frequency selection signal FSEL3 may maintain the logic low level L such that the third core clock signal CCK3 may maintain the first frequency F1. As described above, the interface clock signal IFCK may maintain the second frequency F2 regardless of the frequency selection signals FSEL1~FSEL3.

FIG. 3 illustrates a case that the frequency of the second core clock signal CCK2 is changed from the second frequency F2 to the first frequency F1.

The second frequency selection signal FSEL2 may transition from the logic high level H to the logic low level L at a time point T0 to indicate that the frequency of the second core clock signal CCK2 is changed from the second frequency F2 to the first frequency F1. The first frequency selection signal FSEL1 may maintain the logic low level L such that the first core clock signal CCK1 may maintain the first frequency F1, and the third frequency selection signal FSEL3 may maintain the logic low level L such that the third core clock signal CCK3 may maintain the first frequency F1. As described above, the interface clock signal IFCK may maintain the second frequency F2 regardless of the frequency selection signals FSEL1~FSEL3.

The second clock signal CLK2 may be generated by dividing the first clock signal CLK1. As a result, the transitioning time point, that is, the edges of the first clock signal CLK1 and the second clock signal CLK2 may be synchronized. In contrast, the frequency selection signals FSEL1~FSEL3 may be provided from a control circuit configured to control the performance and the power consumption of the multi-core system. The control circuit may operate based on a clock signal output from a crystal oscillator and thus the transitioning time point T0 of the first frequency selection signal FSEL1 or the second frequency selection signal FSEL2 may not be synchronized with the edges of the first clock signal CLK1 and the second clock signal CLK2.

The clock management circuit 200 may simultaneously deactivated the plurality of core clock signals CCK1~CCK3 and the interface clock signal IFCK in a clock gating period tCG between a gating start time point Tgs and a gating end time point Tge. Here, the deactivation of the clock signal indicates that the clock signal stops toggling and maintains a constant voltage level. As will be described below, the control logic 110 may generate core busy signals respectively corresponding to the frequency selection signals FSEL1~FSEL3 and the clock management circuit 200 may generate a clock gating signal based on the core busy signals such that the clock gating signal may be activated to control the clock gating period tCG when the frequency of at least one of the core clock signals CCK1~CCK3 is changed. A delay time tDL between the transitioning time point T0 and the gating start time point Tgs may be set with a proper value according to a configuration of the clock management circuit 200.

Figure 4:
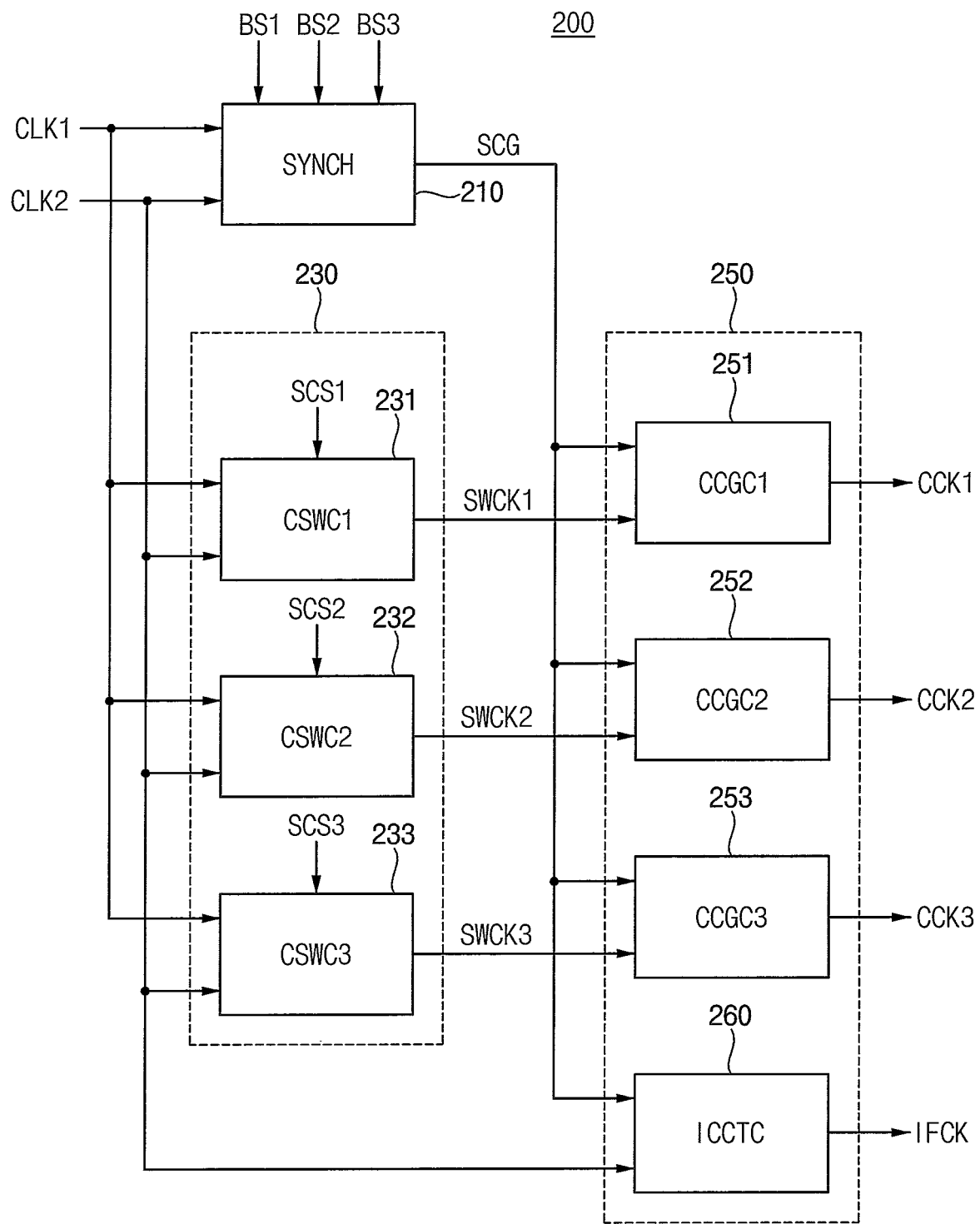
FIG. 4 is a block diagram illustrating a clock management circuit according to example embodiments.

FIG. 4 is a block diagram illustrating a clock management circuit according to example embodiments.

Referring to FIG. 4, a clock management circuit 200 may include a synchronization circuit SYNCH 210, a switching circuit 230 and a gating circuit 250.

The synchronization circuit 210 may generate a clock gating signal SCG that is activated to control a clock gating period tCG when a frequency of at least one of the plurality of core clock signals CCK1~CCK3 is changed. The control logic 110 in FIG. 1 may generate core busy signals BS1~BS3 based on the frequency selection signals FSEL1~FSEL3 and the frequency selection signals FSEL1~FSEL3 and the core busy signals BS1~BS3 may not be synchronized with the first clock signal CLK1 and the second clock signal CLK2 as described above. The synchronization circuit 210 may generate the clock gating signal SCG by synchronizing the core busy signals BS1~BS3 with the first clock signal CLK1 and the second clock signal CLK2, as will be described below with reference to FIGS. 12 through 15.

The switching circuit 230 may include a plurality of clock switching circuits CSWC1~CSWC3 231~233. The plurality of clock switching circuits 231~233 may generate a plurality of switching clock signals SWCK1~SWCK3 corresponding to the plurality of core clock signals CCK1~CCK3 by selecting one of the first clock signal CLK1 and the second clock signal CLK2 based on a plurality of clock switching signals SCS1~SCS3 transitioning at a frequency changing time point, respectively. Example embodiments of the switching circuit 230 will be described below with reference to FIGS. 5 through 11.

The gating circuit 250 may include a plurality of core clock gating circuits CCGC1~CCGC3 251~253 and an interface clock gating circuit ICCTC 260. The plurality of core clock gating circuits 251~253 may generate the plurality of core clock signals CCK1~CCK3 respectively corresponding to the plurality of switching clock signals SWCK1~SWCK3 by deactivating the plurality of switching clock signals SWCK1~SWCK3 in the clock gating period tCG based on the clock gating signal SCG. The interface clock gating circuit 260 may generate the interface clock signal IFCK by deactivating the second clock signal CLK2 in the clock gating period tCG based on the clock gating signal SCG. Example embodiments of the gating circuit 250 will be described below with reference to FIGS. 16 and 17.

Figure 5:
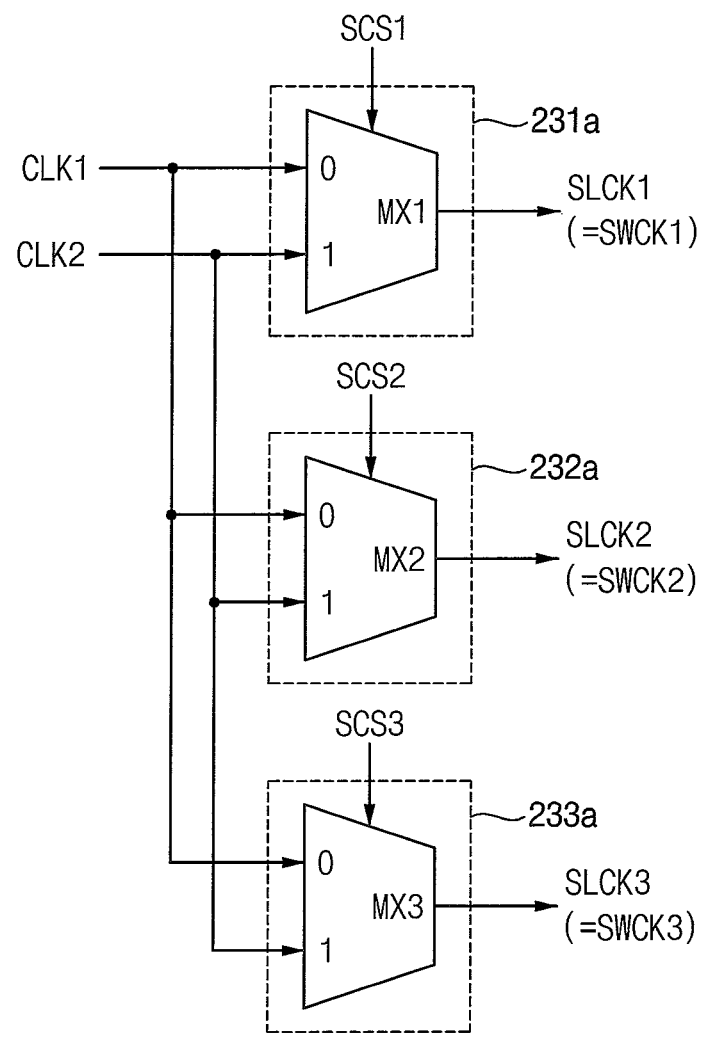
FIG. 5 is a diagram illustrating an example embodiment of a switching circuit included in the clock management circuit of FIG. 4.

FIG. 5 is a diagram illustrating an example embodiment of a switching circuit included in the clock management circuit of FIG. 4.

Referring to FIG. 5, a switching circuit 230a may include a plurality of clock switching circuits 231a-233a, and each of the plurality of clock switching circuits 231a-233a may include a corresponding multiplexer of a plurality of multiplexers MX1~MX3.

Each of the multiplexers MX1~MX3 may generate a corresponding selection clock signal of a plurality of selection clock signals SLCK1~SLCK3 by selecting one of the first clock signal CLK1 and the second clock signal CLK2 based on each of the clock switching signals SCS1~SCS3.

For example, each of the first through third multiplexers MX1~MX3 may select and output the first clock signal CLK1 having the first frequency F1 when each of the first through third clock switching signals SCS1~SCS3 has the logic low level L corresponding to the logic value '0', and may select and output the second clock signal CLK2 having the second frequency F2 when each of the first through third clock switching signals SCS1~SCS3 has the logic high level H corresponding to the logic value '1'.

The first multiplexer MX1 may generate a first selection clock signal SLCK1 by selecting one of the first clock signal CLK1 and the second clock signal CLK2 based on the first clock switching signal SCS1. For example, the first multiplexer MX1 may generate the first selection clock signal SLCK1 by selecting one of the first clock signal CLK1 and the second clock signal CLK2 based on the first clock switching signal SCS1 that transitions when the frequency of the first core clock signal CCK1 provided to the first processor core 301 is changed. The first selection clock signal SLCK1 may be provided to the gating circuit 250 as the first switching clock signal SWCK1.

The second multiplexer MX2 may generate a second selection clock signal SLCK2 by selecting one of the first clock signal CLK1 and the second clock signal CLK2 based on the second clock switching signal SCS2. For example, the second multiplexer MX2 may generate the second selection clock signal SLCK2 by selecting one of the first clock signal CLK1 and the second clock signal CLK2 based on the second clock switching signal SCS2 that transitions when the frequency of the second core clock signal CCK2 provided to the second processor core 302 is changed. The second selection clock signal SLCK2 may be provided to the gating circuit 250 as the second switching clock signal SWCK2.

The third multiplexer MX3 may generate a third selection clock signal SLCK3 by selecting one of the first clock signal CLK1 and the second clock signal CLK2 based on the third clock switching signal SCS3. For example, the third multiplexer MX3 may generate the third selection clock signal SLCK3 by selecting one of the first clock signal CLK1 and the second clock signal CLK2 based on the third clock switching signal SCS3 that transitions when the frequency of the third core clock signal CCK3 provided to the third processor core 303 is changed. The third selection clock signal SLCK3 may be provided to the gating circuit 250 as the third switching clock signal SWCK3.

Figure 6:
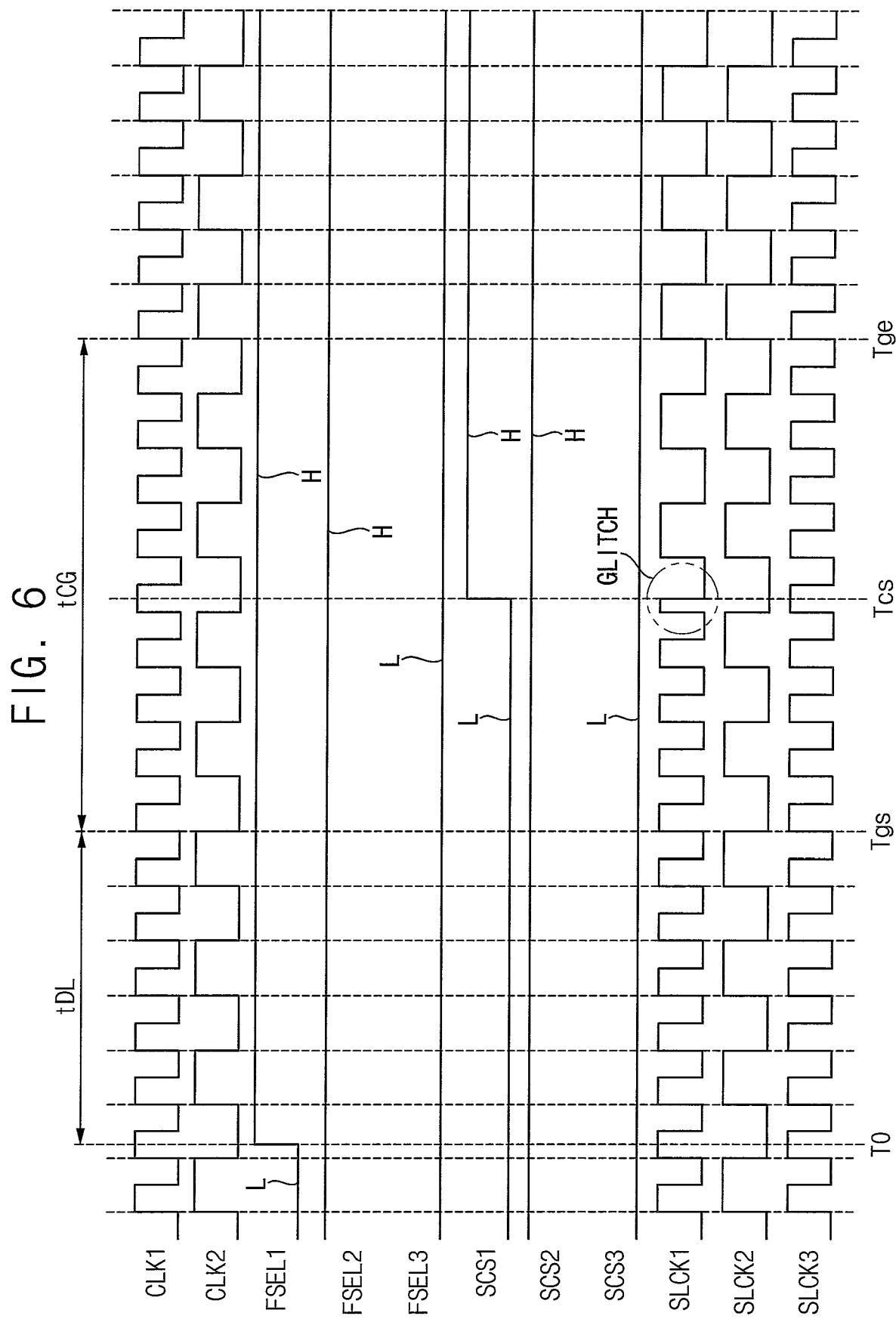
FIGS. 6 and 7 are timing diagrams illustrating operations of the switching circuit of FIG. 5 according to example embodiments.
Figure 7:
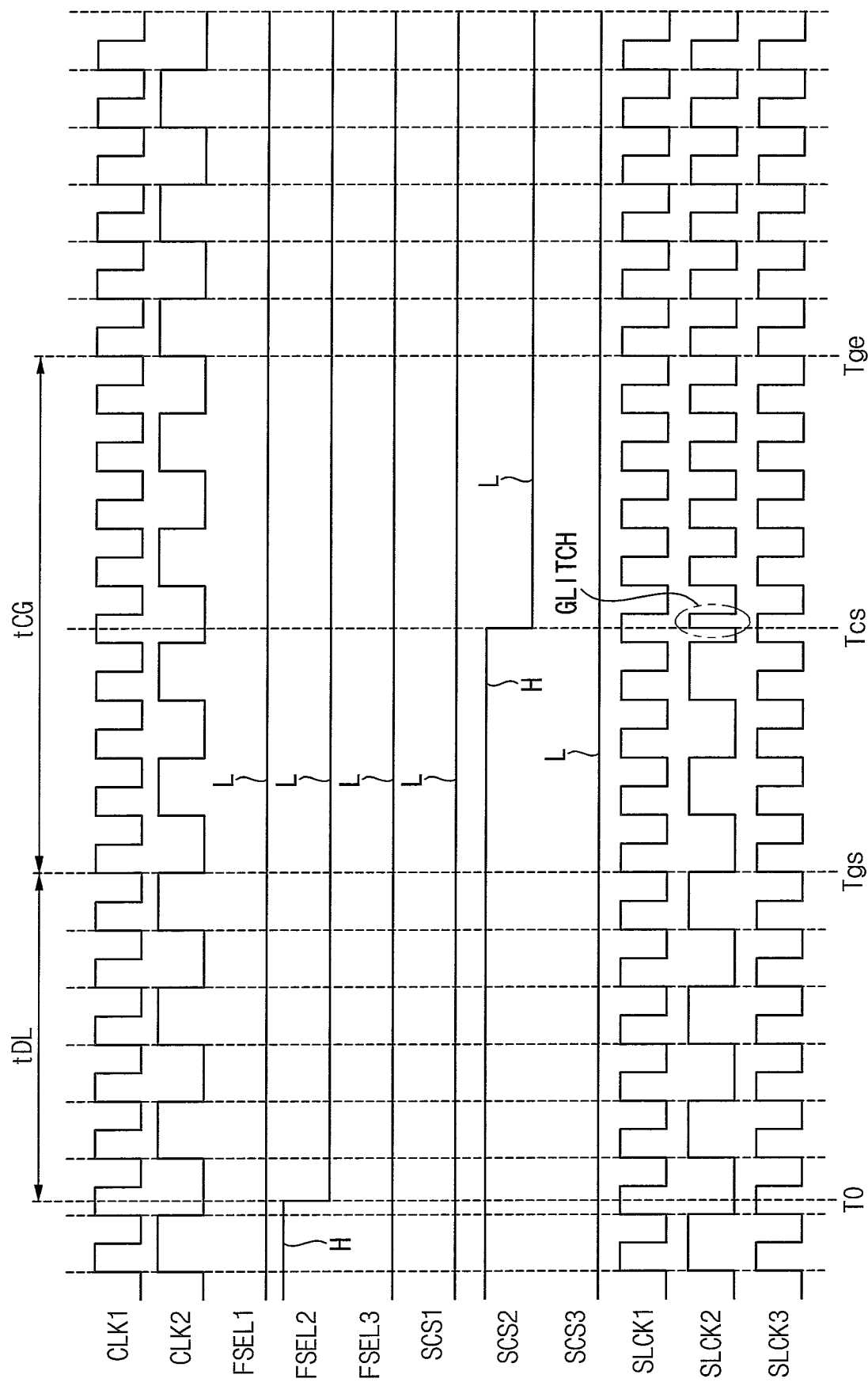

FIGS. 6 and 7 are timing diagrams illustrating operations of the switching circuit of FIG. 5 according to example embodiments. The descriptions repeated with FIGS. 2 and 3 may be omitted.

FIG. 6 illustrates a case that the frequency of the first core clock signal CCK1 is changed from the first frequency F1 to the second frequency F2.

Referring to FIGS. 1, 5 and 6, the control logic 110 may generate the first clock switching signal SCS1 transitioning at the frequency changing time point Tcs from the logic low level L to the logic high level H based on the first frequency selection signal FSEL1. The control logic 110 may generate the first clock switching signal SCS1 by delaying the first frequency selection signal FSEL1 such that the frequency changing time point Tcs may be included in the clock gating period tCG. The control logic 110 may maintain the logic high level H of the second clock switching signal SCS2 based on the second frequency selection signal FSEL2 and may maintain the logic low level L of the third clock switching signal SCS3 based on the third frequency selection signal FSEL3.

As a result, the first multiplexer MX1 may output the first selection clock signal SLCK1 based on transitioning of the first clock switching signal SCS1 such that the first selection clock signal SLCK1 corresponds to the first clock signal CLK1 before the frequency changing time point Tcs and corresponds to the second clock signal CLK2 after the frequency changing time point Tcs. The second multiplexer MX2 may output the second clock signal CLK2 as the second selection clock signal SLCK2 regardless of the frequency changing time point Tcs based on the second clock switching signal SCS2 maintaining the logic high level H. The third multiplexer MX3 may output the first clock signal CLK1 as the third selection clock signal SLCK3 regardless of the frequency changing time point Tcs based on the third clock switching signal SCS3 maintaining the logic low level L.

FIG. 7 illustrates a case that the frequency of the second core clock signal CCK2 is changed from the second frequency F2 to the first frequency F1.

Referring to FIGS. 1, 5 and 7, the control logic 110 may generate the second clock switching signal SCS2 transitioning at the frequency changing time point Tcs from the logic high level H to the logic low level L based on the second frequency selection signal FSEL2. The control logic 110 may generate the second clock switching signal SCS2 by delaying the second frequency selection signal FSEL2 such that the frequency changing time point Tcs may be included in the clock gating period tCG. The control logic 110 may maintain the logic low level L of the first and third clock switching signal SCS1 and SCS3 based on the first and third frequency selection signal FSEL1 and FSEL3.

As a result, the second multiplexer MX2 may output the second selection clock signal SLCK2 based on transitioning of the second clock switching signal SCS2 such that the second selection clock signal SLCK2 corresponds to the second clock signal CLK2 before the frequency changing time point Tcs and corresponds to the first clock signal CLK1 after the frequency changing time point Tcs.

The first and third multiplexers MX1 and MX3 may output the first clock signal CLK1 as the first and third selection clock signals SLCK1 and SLCK3 regardless of the frequency changing time point Tcs based on the first and third clock switching signals SCS1 and SCS3 maintaining the logic low level L.

The control logic 110 in FIG. 1 may generate the first through third clock switching signals SCS1~SCS3 respectively corresponding to the first through third frequency selection signals FSEL1~FSEL3. As described above, the transitioning time point of the clock switching signals SCS1~SCS3, that is, the frequency changing time point Tcs may not be synchronized with the edges of the first clock signal CLK1 and the second clock signal CLK2. Accordingly the outputs of the multiplexers, for example, the first selection clock signal SLCK1 in FIG. 6 and the second selection clock signal SLCK2 in FIG. 7 may include a glitch when the frequency is changed. In some example embodiments, the glitch may be removed as will be described below with reference to FIGS. 8 through 11.

Figure 8:
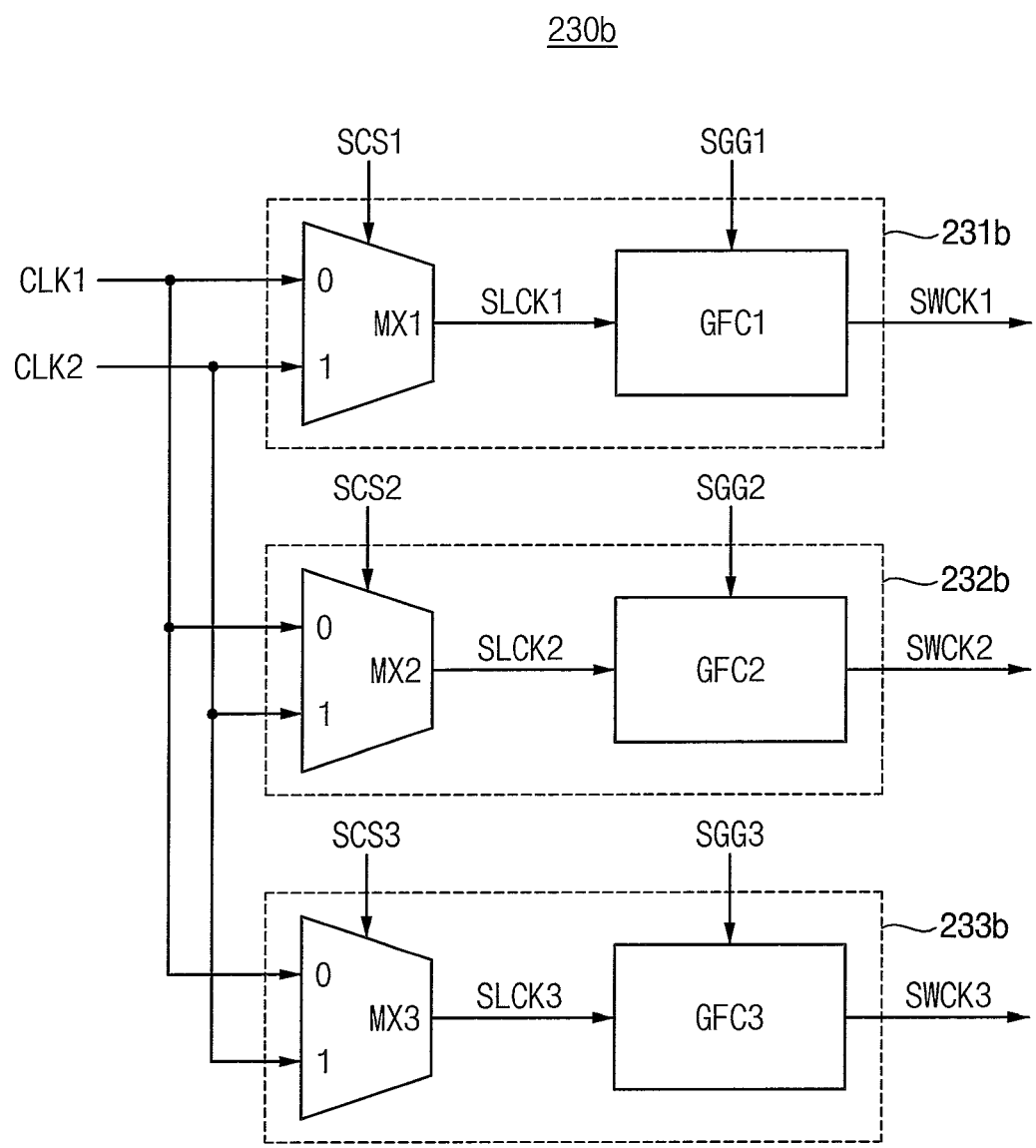
FIG. 8 is a diagram illustrating an example embodiment of a switching circuit included in the clock management circuit of FIG. 4.

FIG. 8 is a diagram illustrating an example embodiment of a switching circuit included in the clock management circuit of FIG. 4.

Referring to FIG. 8, a switching circuit 230b may include a plurality of clock switching circuits 231b-233b, and each of the plurality of clock switching circuits 231b-233b may include a corresponding multiplexer of a plurality of multiplexers MX1~MX3 and a corresponding glitch free circuit of a plurality of glitch free circuits GFC1~GFC3.

Each of the multiplexers MX1~MX3 may generate a corresponding selection clock signal of a plurality of selection clock signals SLCK1~SLCK3 by selecting one of the first clock signal CLK1 and the second clock signal CLK2 based on a corresponding clock switching signal of the clock switching signals SCS1~SCS3. The multiplexers MX1~MX3 may be the same as described with reference to FIGS. 5 through 7 and the repeated descriptions are omitted.

Each of the glitch free circuits GFC1~GFC3 may generate each of a plurality of switching clock signals SWCK1~SWCK3 by removing a glitch at the clock changing time point Tcs from each of the plurality of selection clock signals SLCK1~SLCK3.

In some example embodiments, the glitch free circuits GFC1~GFC3 may perform a glitch removing operation or a glitch masking operation based on glitch gating signals SGG1~SGG3 to control a glitch gating period tGM.

The first glitch free circuit GFC1 may generate the first switching clock signal SWCK1 by removing the glitch of the first selection clock signal SLCK1 based on the first glitch gating signal SGG1 that is activated during a specific period when the frequency of the first core clock signal CCK1 provided to the first processor core 301 is changed.

The second glitch free circuit GFC2 may generate the second switching clock signal SWCK2 by removing the glitch of the second selection clock signal SLCK2 based on the second glitch gating signal SGG2 that is activated during a specific period when the frequency of the second core clock signal CCK2 provided to the second processor core 302 is changed.

The third glitch free circuit GFC3 may generate the third switching clock signal SWCK3 by removing the glitch of the third selection clock signal SLCK3 based on the third glitch gating signal SGG3 that is activated during a specific period when the frequency of the third core clock signal CCK3 provided to the third processor core 303 is changed.

Figure 9:
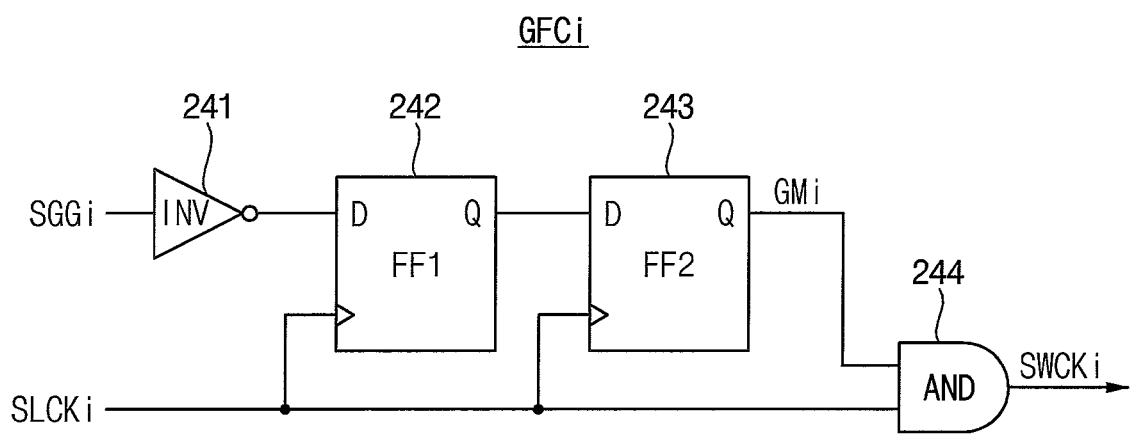
FIG. 9 is a diagram illustrating an example embodiment of a glitch-free circuit included in the switching circuit of FIG. 8.

FIG. 9 is a diagram illustrating an example embodiment of a glitch-free circuit included in the switching circuit of FIG. 8.

Referring to FIG. 9, each glitch free circuit GFCi (i=1, 2 or 3) may include an inverter INV 241, a first flip-flop FF1 242, a second flip-flop FF2 243 and an AND gate 244.

The inverter 241 may invert each glitch gating signal SGGi. The first flip-flop 242 may include a data terminal D receiving the output of the inverter 241 and a clock terminal receiving each selection clock signal SLCKi. The second flip-flop 243 may include a data terminal D connected to an output terminal Q of the first flip-flop 242, a clock terminal receiving each selection clock signal SLCKi and an output terminal outputting each glitch mask signal GMi. The AND gate 244 may perform an AND logic operation on each glitch mask signal GMi and each selection clock signal SLCKi to generate each switching clock signal SWCKi.

Figure 10:
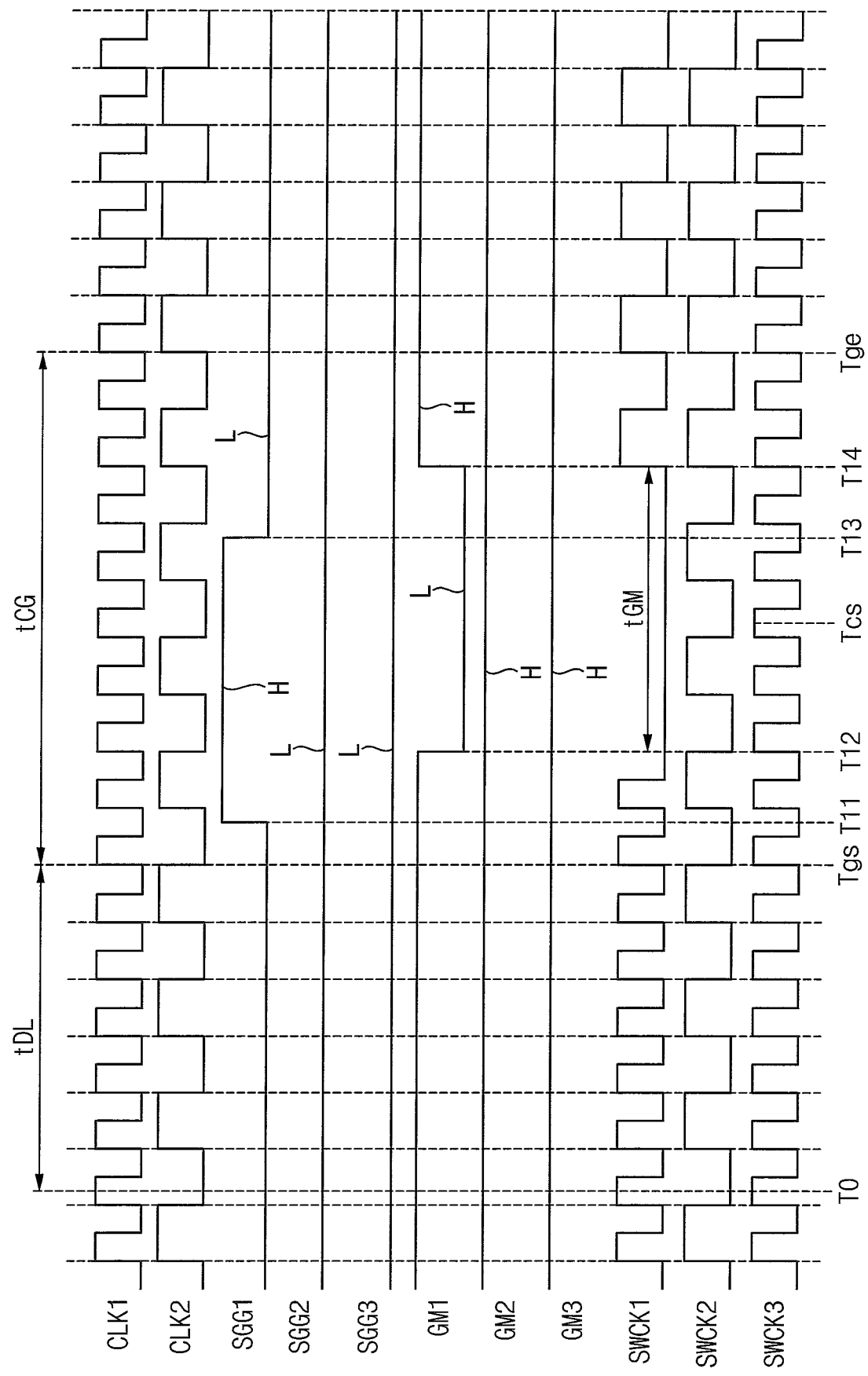
FIGS. 10 and 11 are timing diagrams illustrating operations of the switching circuit of FIG. 8 according to example embodiments.
Figure 11:
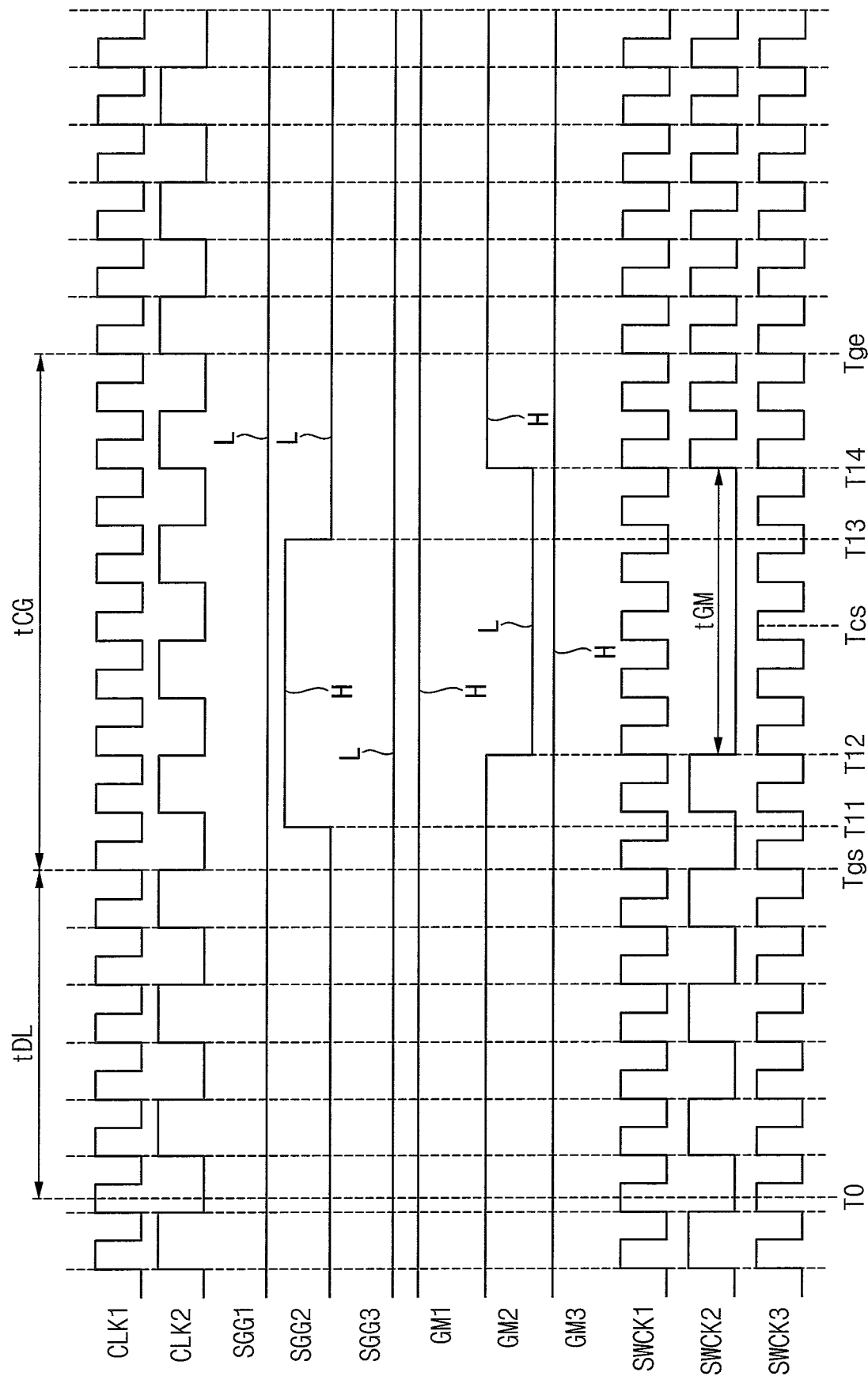

FIGS. 10 and 11 are timing diagrams illustrating operations of the switching circuit of FIG. 8 according to example embodiments. The descriptions repeated with FIGS. 6 and 7 may be omitted.

FIG. 10 illustrates a case that the frequency of the first core clock signal CCK1 is changed from the first frequency F1 to the second frequency F2.

Referring to FIGS. 1, 8, 9 and 10, the control logic 110 may generate the first glitch gating signal SGG1 that is activated in the logic high level H between time points T11 and T13 based on the first frequency selection signal FSEL1. The control logic 110 may generate the first glitch gating signal SGG1 such that the frequency changing time point Tcs may be included in the glitch gating period tGM and the glitch gating period tGM may be included in the clock gating period tCG. The control logic 110 may deactivate the second and third glitch gating signals SGG2 and SGG3 in the logic low level L based on the second and third frequency selection signals FSEL2 and FSEL3 maintaining the logic level.

As a result, the first glitch free circuit GFC1 may generate the first switching clock signal SWCK1 by deactivating the first selection clock signal SLCK1 between time points T12 and T14, that is, during the glitch gating period tGM based on the first glitch mask signal GM1 that is activated in the logic low level L during the glitch gating period tGM. The second and third glitch free circuits GFC2 and GFC3 may output the second and third selection clock signals SLCK2 and SLCK3 as the second and third switching clock signals SWCK2 and SWCK3 based on the second and third glitch mask signals GM2 and GM3 that are deactivated in the logic high level H.

FIG. 11 illustrates a case that the frequency of the second core clock signal CCK2 is changed from the second frequency F2 to the first frequency F1.

Referring to FIGS. 1, 8, 9 and 11, the control logic 110 may generate the second glitch gating signal SGG2 that is activated in the logic high level H between time points T11 and T13 based on the second frequency selection signal FSEL2. The control logic 110 may generate the second glitch gating signal SGG2 such that the frequency changing time point Tcs may be included in the glitch gating period tGM and the glitch gating period tGM may be included in the clock gating period tCG. The control logic 110 may deactivate the first and third glitch gating signals SGG1 and SGG3 in the logic low level L based on the first and third frequency selection signals FSEL1 and FSEL3 maintaining the logic level.

As a result, the second glitch free circuit GFC2 may generate the second switching clock signal SWCK2 by deactivating the second selection clock signal SLCK2 between time points T12 and T14, that is, during the glitch gating period tGM based on the second glitch mask signal GM2 that is activated in the logic low level L during the glitch gating period tGM. The first and third glitch free circuits GFC1 and GFC3 may output the first and third selection clock signals SLCK1 and SLCK3 as the first and third switching clock signals SWCK1 and SWCK3 based on the first and third glitch mask signals GM1 and GM3 that are deactivated in the logic high level H.

As described above, the transitioning time points T11 and T13 of the glitch gating signals SGG1~SGG3 may not be synchronized with the first clock signal CLK1 and the second clock signal CLK2. The first and second flip-flops 242 and 243 in FIG. 9 may generate the glitch mask signals GM1~GM3 based on the glitch gating signals SGG1~SGG3 such that the glitch mask signals GM1~GM3 may be synchronized with the selection clock signals SLCK1~SLCK3 synchronizing with edges of the first clock signal CLK1 and the second clock signal CLK2.

Figure 12:
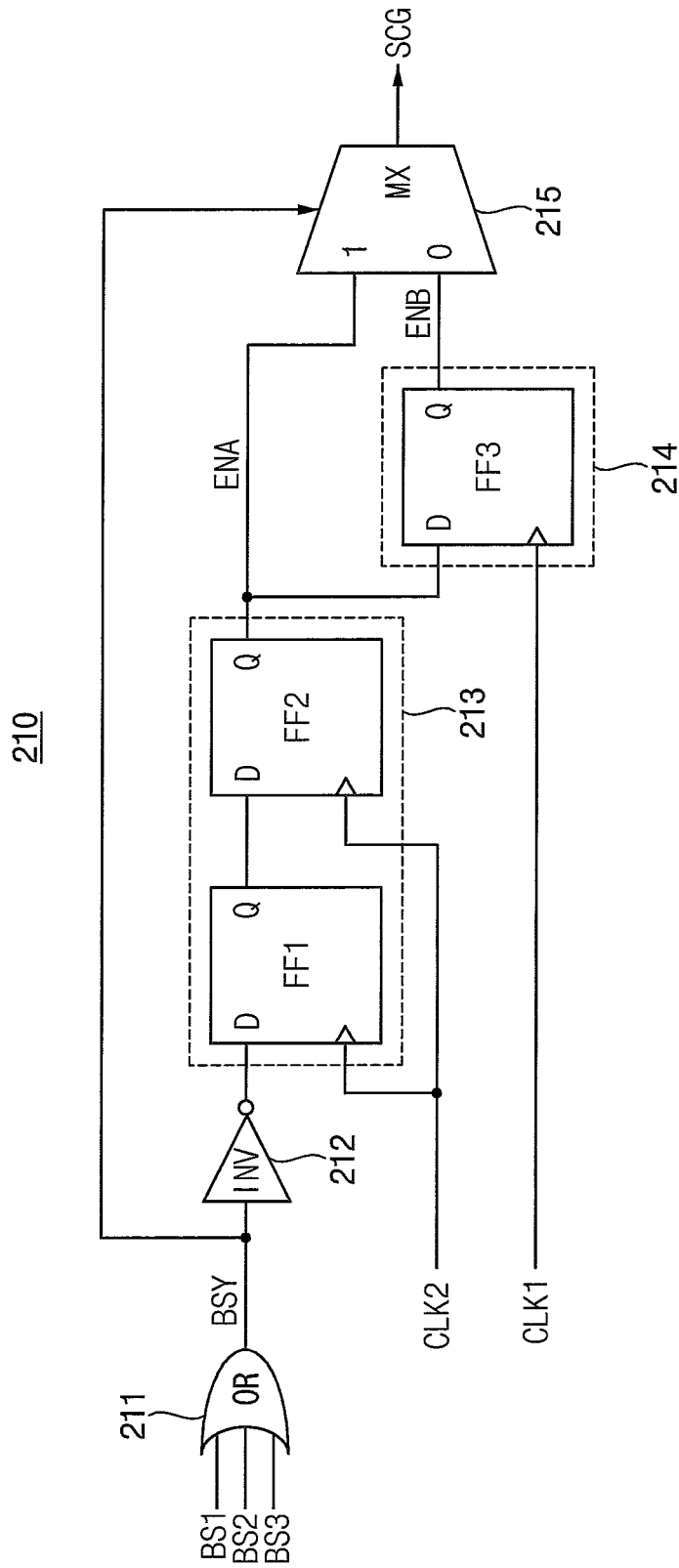
FIG. 12 is a diagram illustrating an example embodiment of a synchronization circuit included in the clock management circuit of FIG. 4.

FIG. 12 is a diagram illustrating an example embodiment of a synchronization circuit included in the clock management circuit of FIG. 4.

Referring to FIG. 12, a synchronization circuit 210 may include an OR gate 211, an inverter INV 212, a first flip-flop circuit 213, a second flip-flop circuit 214 and a multiplexer MX 215.

The OR gate 211 may generate a busy signal BSY by performing an OR logic operation on a plurality of core busy signals BS1~BS3 where each of the plurality of core busy signals BS1~BS3 is activated when a frequency of each of the plurality of core clock signals CCK1~CCK3 is changed. The inverter 212 may invert the busy signal BSY.

The first flip-flop circuit 213 may generate a first enable signal ENA by synchronizing the busy signal BSY with the second clock signal CLK2. For example, the first flip-flop circuit 213 may include a first flip-flop FF1 and a second flip-flop FF2. The first flip-flop FF1 may include a data terminal D receiving the output of the inverter 211, that is, an inversion signal of the busy signal BSY and a clock terminal receiving the second clock signal CLK2. The second flip-flop FF2 may include a data terminal D connected to an output terminal Q of the first flip-flop FF1, a clock terminal receiving the second clock signal CLK2 and an output terminal Q generating the first enable signal ENA.

The second flip-flop circuit 214 may generate a second enable signal ENB by synchronizing the first enable signal ENA with the first clock signal CLK1. For example, the second flip-flop circuit 214 may include a third flip-flop FF3. The third flip-flop FF3 may include a data terminal D receiving the first enable signal ENA, a clock terminal receiving the first clock signal CLK1 and an output terminal Q generating the second enable signal ENB.

The multiplexer 215 may generate the clock gating signal SCG by selecting one of the first enable signal ENA and the second enable signal ENB based on the busy signal BSY. For example, the multiplexer 215 may generate the clock gating signal SCG by selecting the first enable signal ENA in response to the logic high level H of the busy signal BSY and selecting the second enable signal ENB in response to the logic low level L of the busy signal BSY.

Hereinafter the core busy signals BS1~BS3 are described with reference to FIGS. 13 and 14, and operations of the synchronization circuit 210 are described with reference to FIG. 15.

Figure 13:
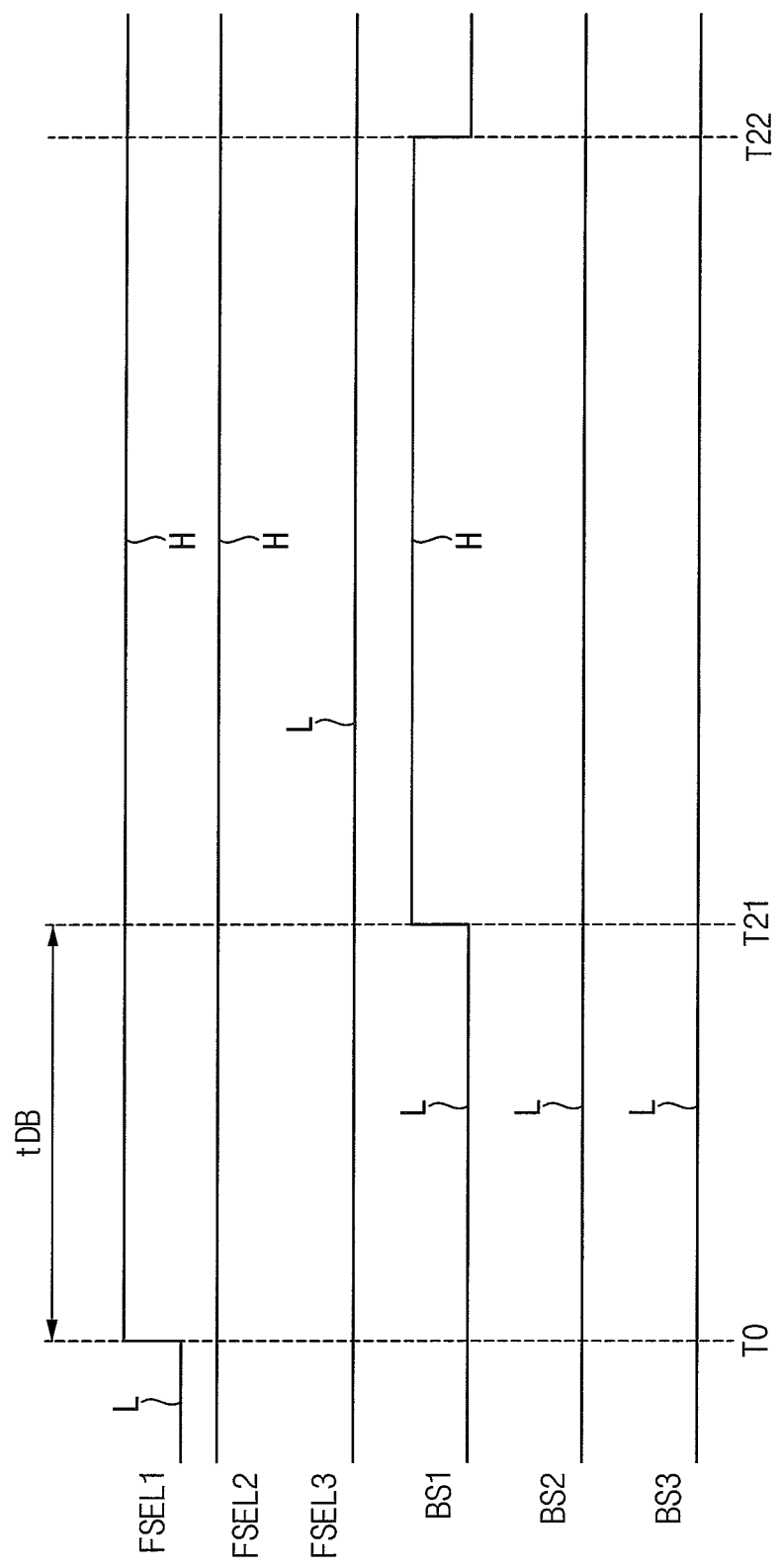
FIGS. 13 and 14 are timing diagrams illustrating core busy signals generated by the clock management circuit of FIG. 4 according to example embodiments.
Figure 14:
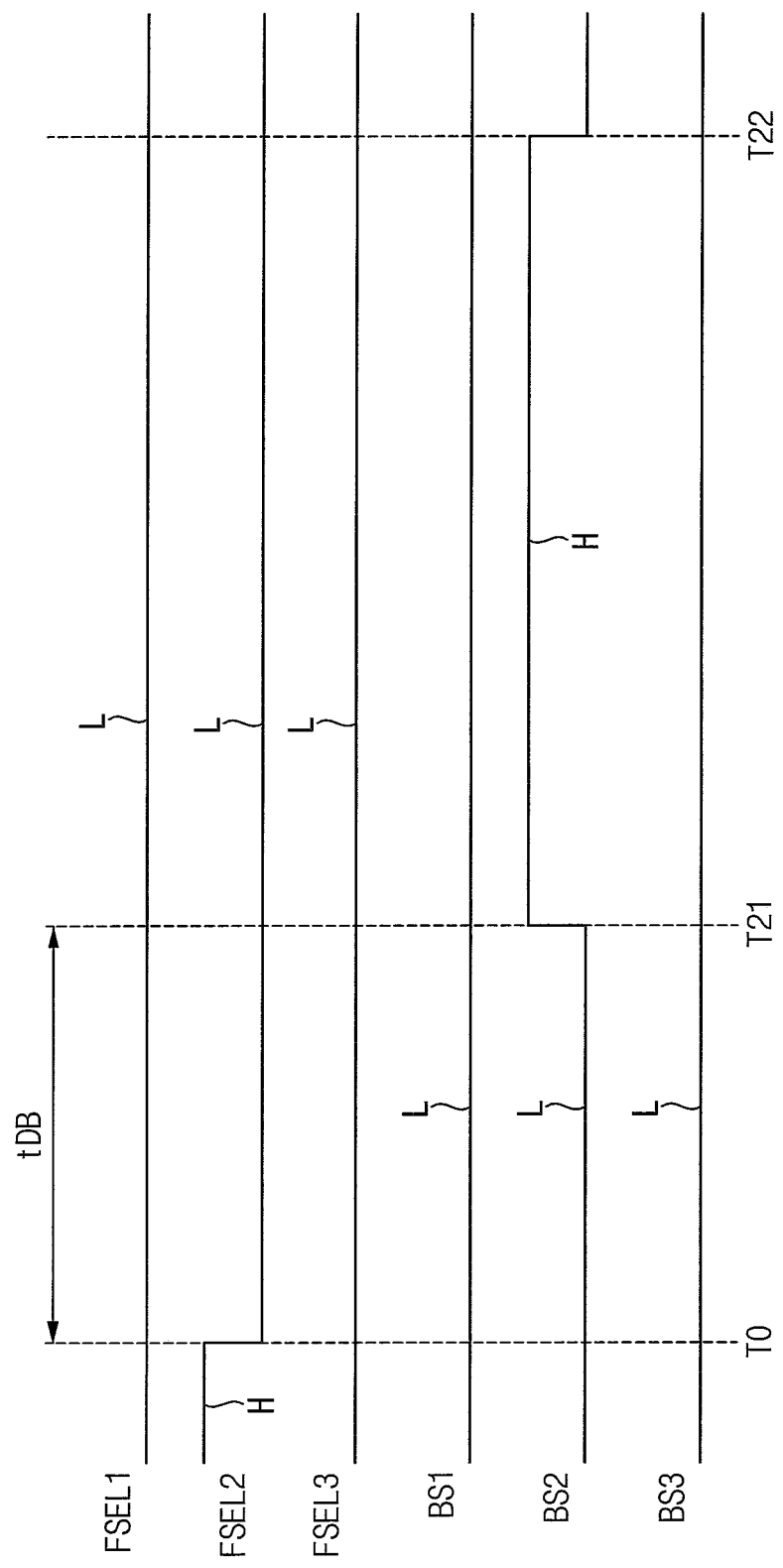

FIGS. 13 and 14 are timing diagrams illustrating core busy signals generated by the clock management circuit of FIG. 4 according to example embodiments.

Referring to FIGS. 1, 13 and 14, the control logic 110 may generate the core busy signals BS1~BS3 respectively corresponding to the frequency selection signals FSEL1~FSEL3.

FIG. 13 illustrates a case that the frequency of the first core clock signal CCK1 is changed from the first frequency F1 to the second frequency F2.

The control logic 110 may generate the first core busy signal BS1 activated in the logic high level H between time points T21 and T22 based on the first frequency selection signal FSEL1. The control logic 110 may deactivate the second and third core busy signals BS2 and BS3 in the logic low level L based on the second and third frequency selection signals FSEL2 and FSEL3 maintaining the logic level.

FIG. 14 illustrates a case that the frequency of the second core clock signal CCK2 is changed from the second frequency F2 to the first frequency F1.

The control logic 110 may generate the second core busy signal BS2 activated in the logic high level H between time points T21 and T22 based on the second frequency selection signal FSEL2. The control logic 110 may deactivate the first and third core busy signals BS1 and BS3 in the logic low level L based on the first and third frequency selection signals FSEL1 and FSEL3 maintaining the logic level.

As such, the control logic 110 may activate, in the logic high level H, the core busy signal corresponding to the frequency selection signal that transitions. A delay time tDB between the transitioning time point T0 of the frequency selection signals FSEL1~FSEL3 and the activation time point of the core busy signals BS1~BS3 may be set to proper values according to a configuration of the clock management circuit 200.

Figure 15:
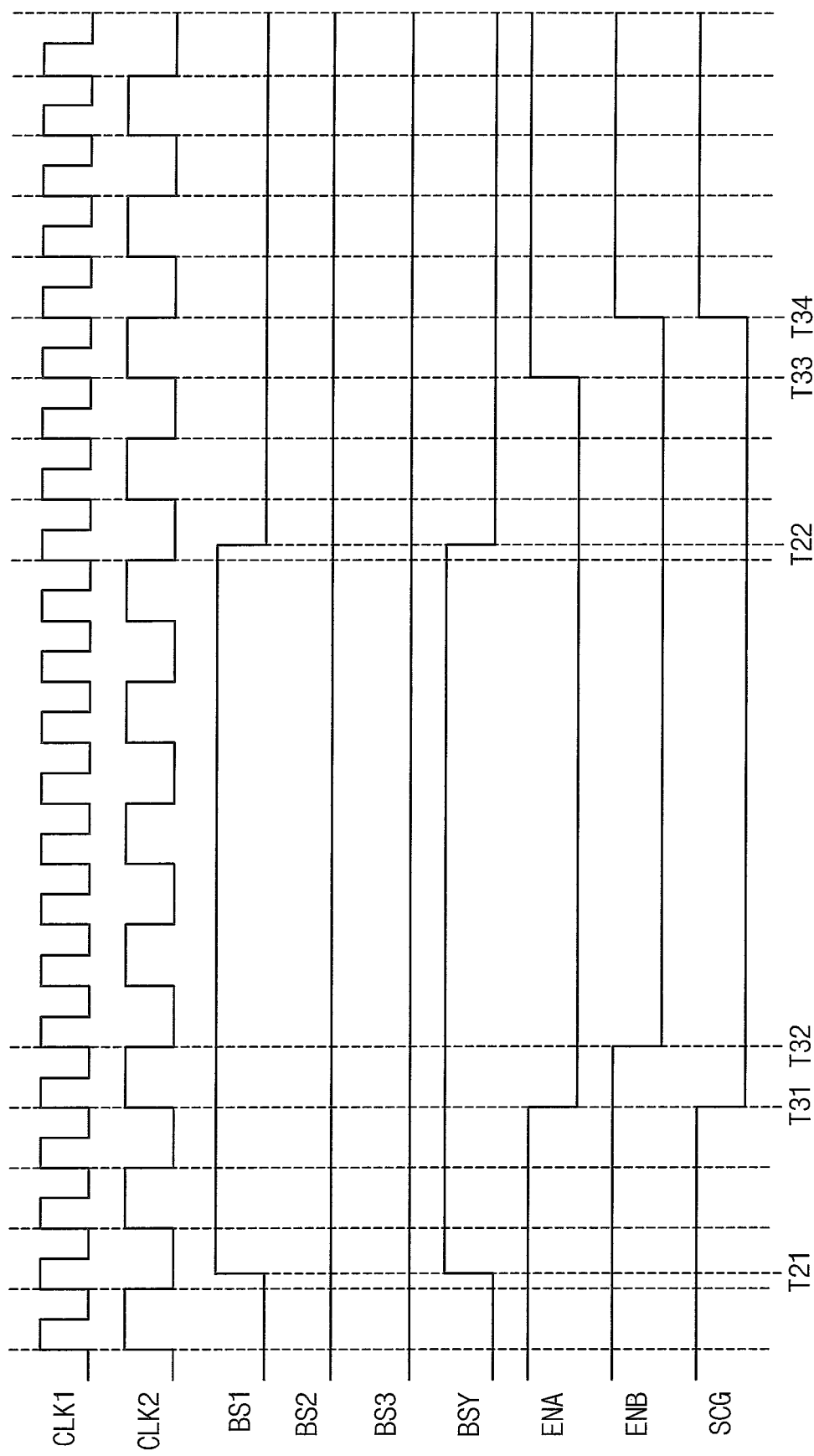
FIG. 15 is a timing diagram illustrating operations of the synchronization circuit of FIG. 12 according to example embodiments.

FIG. 15 is a timing diagram illustrating operations of the synchronization circuit of FIG. 12 according to example embodiments.

Referring to FIGS. 12 through 15, the OR gate 211 may generate the busy signal BSY by performing an OR logic operation on the core busy signals BS1~BS3. FIG. 15 illustrates an example that the frequency of the first core clock signal CCK1 is changed from the first frequency F1 to the second frequency F2 and thus the first core busy signal BS1 is activated in the logic high level H between the time points T21 and T22.

The first flip-flop circuit 213 may generate the first enable signal ENA activated in the logic low level L between time points T31 and T33 by synchronizing the busy signal BSY with the second clock signal CLK2. The second flip-flop circuit 214 may generate the second enable signal ENB activated in the logic low level L between time points T32 and T34 by synchronizing the first enable signal ENA with the first clock signal CLK1.

The multiplexer 215 may generate the clock gating signal SCG by selecting the second enable signal ENB in response to the logic low level L of the busy signal BSY and selecting the first enable signal ENA in response to the logic high level H of the busy signal BSY. As a result, the activation time point T31 of the clock gating signal SCG may coincide with the activation time point of the first enable signal ENA and the deactivation time point T34 of the clock gating signal SCG may coincide with the deactivation time point of the second enable signal ENB. As such, the activation time point T31 of the clock gating signal SCG may be determined based on transitioning of the first enable signal ENA and the deactivation time point T34 of the clock gating signal SCG may be determined based on transitioning of the second enable signal ENB. As will be described below with reference to FIGS. 16 and 17, the above-described clock gating period tCG may be controlled with the activation time duration T31~T34 of the clock gating signal SCG.

Figure 16:
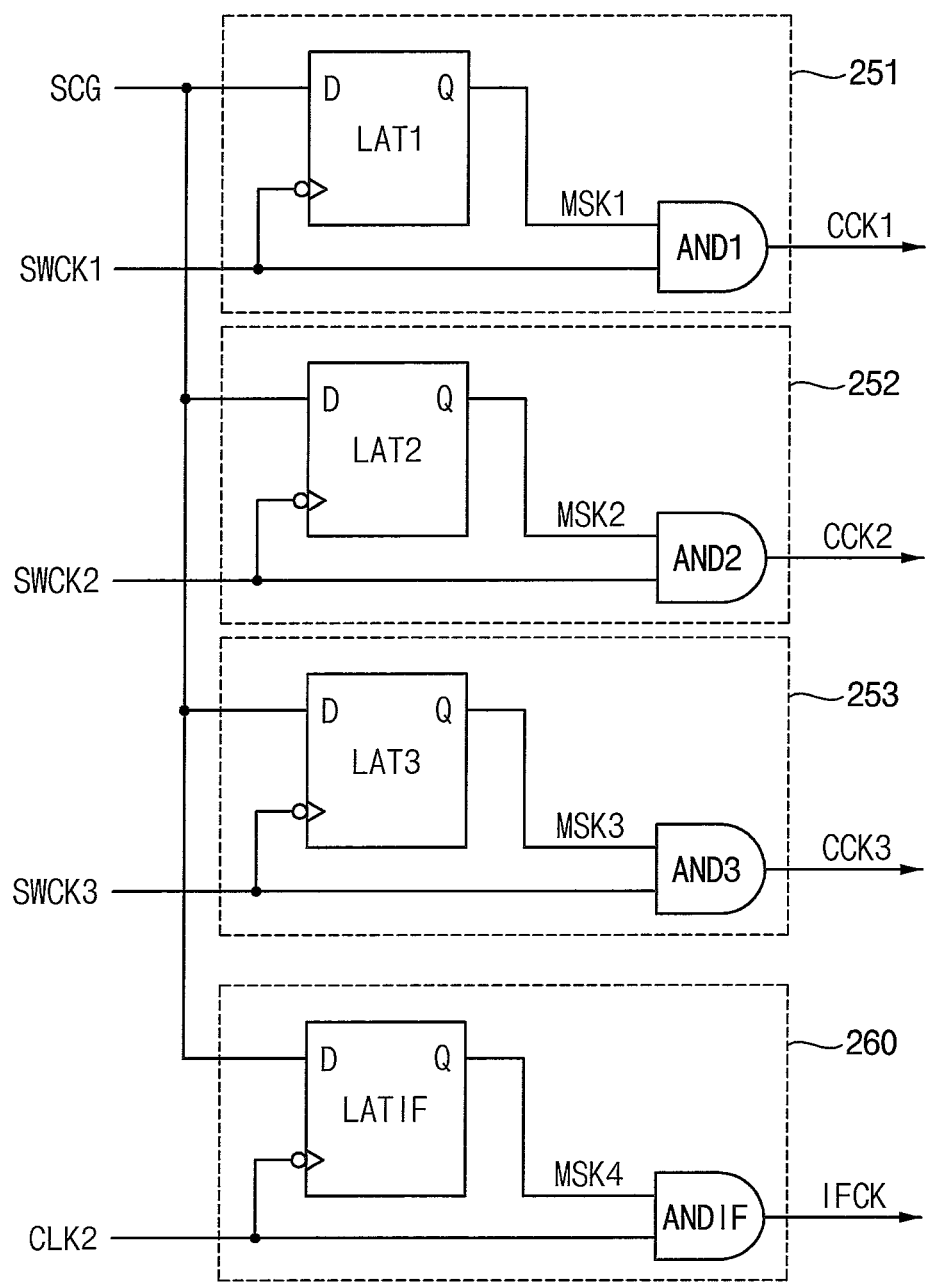
FIG. 16 is a diagram illustrating an example embodiment of a gating circuit included in the clock management circuit of FIG. 4.

FIG. 16 is a diagram illustrating an example embodiment of a gating circuit included in the clock management circuit of FIG. 4.

Referring to FIG. 16, a gating circuit 250 may include a plurality of core clock gating circuits 251~253 and an interface clock gating circuit 260.

The plurality of core clock gating circuit 251~253 may generate a plurality of core clock signals CCK1~CCK3 by deactivating the plurality of switching clock signals SWCK1~SWCK3 in the clock gating period tCG based on the clock gating signal SCG. The interface clock gating circuit 260 may generate an interface clock signal IFCK by deactivating the second clock signal CLK2 in the clock gating period tCG based on the clock gating signal SCG.

Each of the core clock gating circuits 251~253 may include a latch circuit LATi and an AND gate ANDi (i=1, 2 or 3). The latch circuit LATi may include a data terminal D receiving the clock gating signal SCG, a clock terminal receiving an inversion signal of a switching clock signal SWCKi, and an output terminal Q generating a mask signal MSKi. The AND gate ANDi may generate a core clock signal CCKi by performing an AND logic operation on the mask signal MSKi and the switching clock signal SWCKi.

The interface clock gating circuit 260 may include a latch circuit LATIF and an AND gate ANDIF. The latch circuit LATIF may include a data terminal D receiving the clock gating signal SCG, a clock terminal receiving an inversion signal of the second clock signal CLK2, and an output terminal Q generating a mask signal MSK4. The AND gate ANDIF may generate an interface clock signal IFCK by performing an AND logic operation on the mask signal MSK4 and the second clock signal CLK2.

Figure 17:
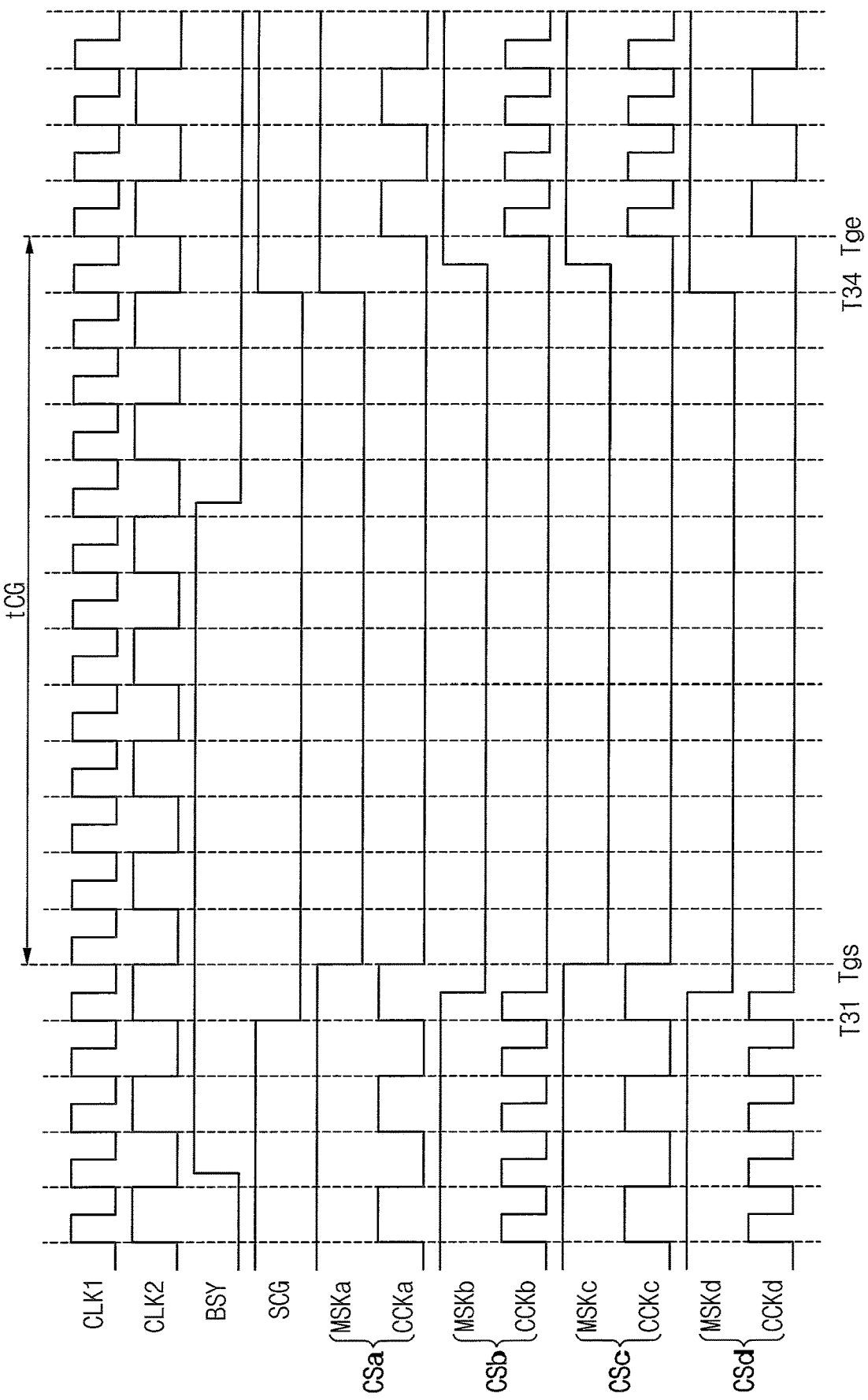
FIG. 17 is a timing diagram illustrating overall operations of a clock management circuit according to example embodiments.

FIG. 17 is a timing diagram illustrating overall operations of a clock management circuit according to example embodiments. The busy signal BSY and the clock gating signal SCG are the same as described with reference to FIGS. 12 through 15, and the repeated descriptions are omitted.

FIG. 17 illustrates various combinations of the mask signal of FIG. 16 and the corresponding core clock signal when the frequency of one of the core clock signals is changed.

A first combination CSa indicates a case that a core clock signal CCKa maintains the second frequency F2. In this case, the mask signal MSKa may be activated in the logic low level L in synchronization with a falling edge of the second clock signal CLK2 and may be deactivated in logic high level H in synchronization with a falling edge of the second clock signal CLK2. The interface clock signal IFCK is the same as the first combination CSa because the interface clock signal is fixed with the second frequency F2.

A second combination CSb indicates a case that a core clock signal CCKb maintains the first frequency F1. In this case, the mask signal MSKb may be activated in the logic low level L in synchronization with a falling edge of the first clock signal CLK1 and may be deactivated in logic high level H in synchronization with a falling edge of the first clock signal CLK1.

A third combination CSc indicates a case that a core clock signal CCKc is changed from the second frequency F2 to the first frequency F1. In this case, the mask signal MSKc may be activated in the logic low level L in synchronization with a falling edge of the second clock signal CLK2 and may be deactivated in logic high level H in synchronization with a falling edge of the first clock signal CLK1.

A fourth combination CSd indicates a case that a core clock signal CCKd is changed from the first frequency F1 to the second frequency F2. In this case, the mask signal MSKd may be activated in the logic low level L in synchronization with a falling edge of the first clock signal CLK1 and may be deactivated in logic high level H in synchronization with a falling edge of the second clock signal CLK2.

As such, the clock management circuit according to example embodiments may generate the clock gating signal SCG that is activated to control the clock gating period tCG when at least one frequency of the plurality of core clock signals CCK1~CCK3 is changed and simultaneously deactivating the plurality of core clock signals CCK1~CCK3 and the interface clock signal IFCK in the clock gating period tCG based on the clock gating signal SCG. The operation errors due to the clock change may be reduced or prevented by simultaneously deactivating the plurality of core clock signals CCK1~CCK3 and the interface clock signal IFCK.

Figure 18:
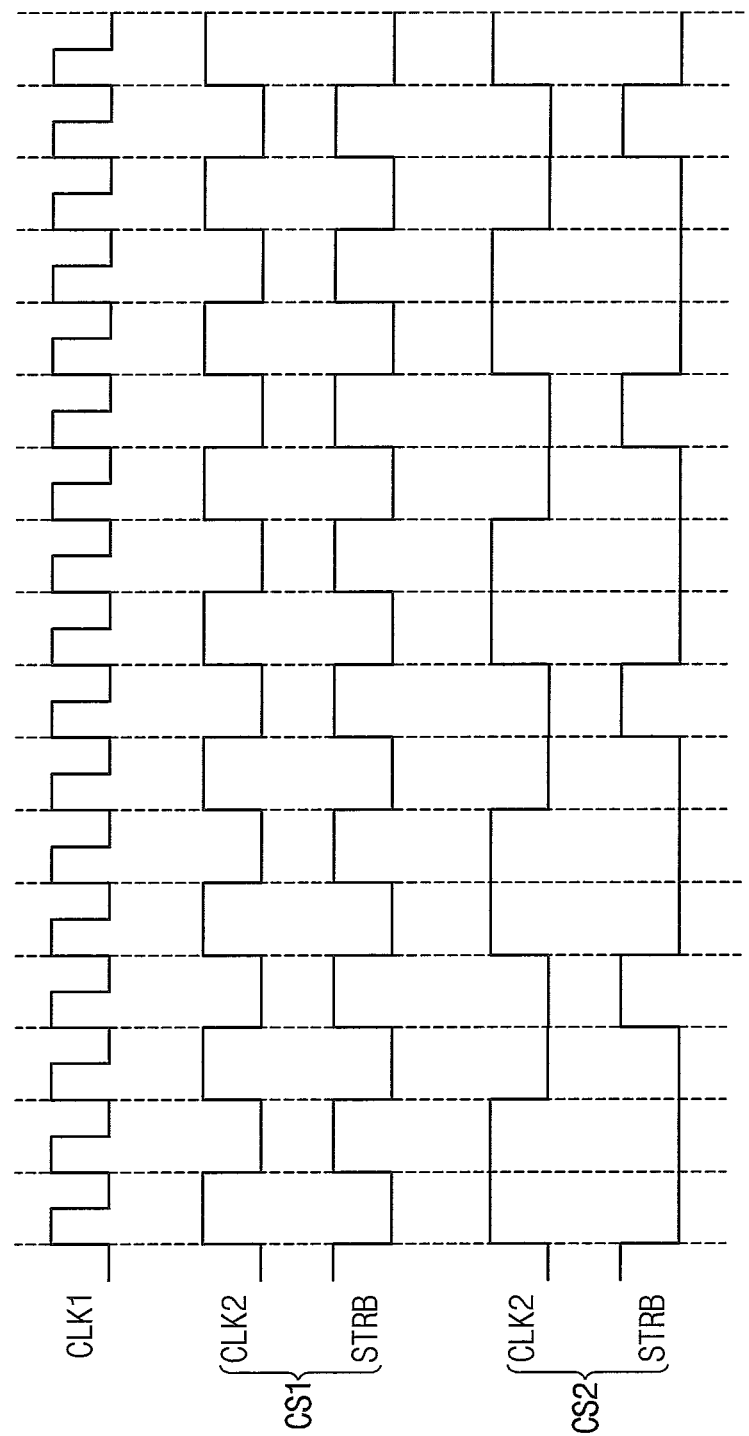
FIG. 18 is a timing diagram illustrating operations of a clock divider included in the multi-core system of FIG. 1 according to example embodiments.

FIG. 18 is a timing diagram illustrating operations of a clock divider included in the multi-core system of FIG. 1 according to example embodiments.

Referring to FIGS. 1 and 18, the clock divider 120 may generate a strobe signal STRB having the second frequency F2 in addition to the second clock signal CLK2.

A first combination CS1 indicates a case that the second clock signal CLK2 and the strobe signal STRB toggle with the second frequency F2 corresponding to a half of the first frequency F1. A second combination CS2 indicates a case that the second clock signal CLK2 and the strobe signal STRB toggle with the second frequency F2 corresponding to a quarter of the first frequency F1. FIG. 18 illustrates examples that the strobe signal STRB toggles to the logic high level H while the second clock signal CLK2 is in the logic low level L, but example embodiments are not limited thereto. Example embodiments are described based on the division ratio of ½ in this disclosure, but the division ratio of the clock divider 120 may be determined variously such as ½, ⅓, ¼ and so on.

Figure 19:
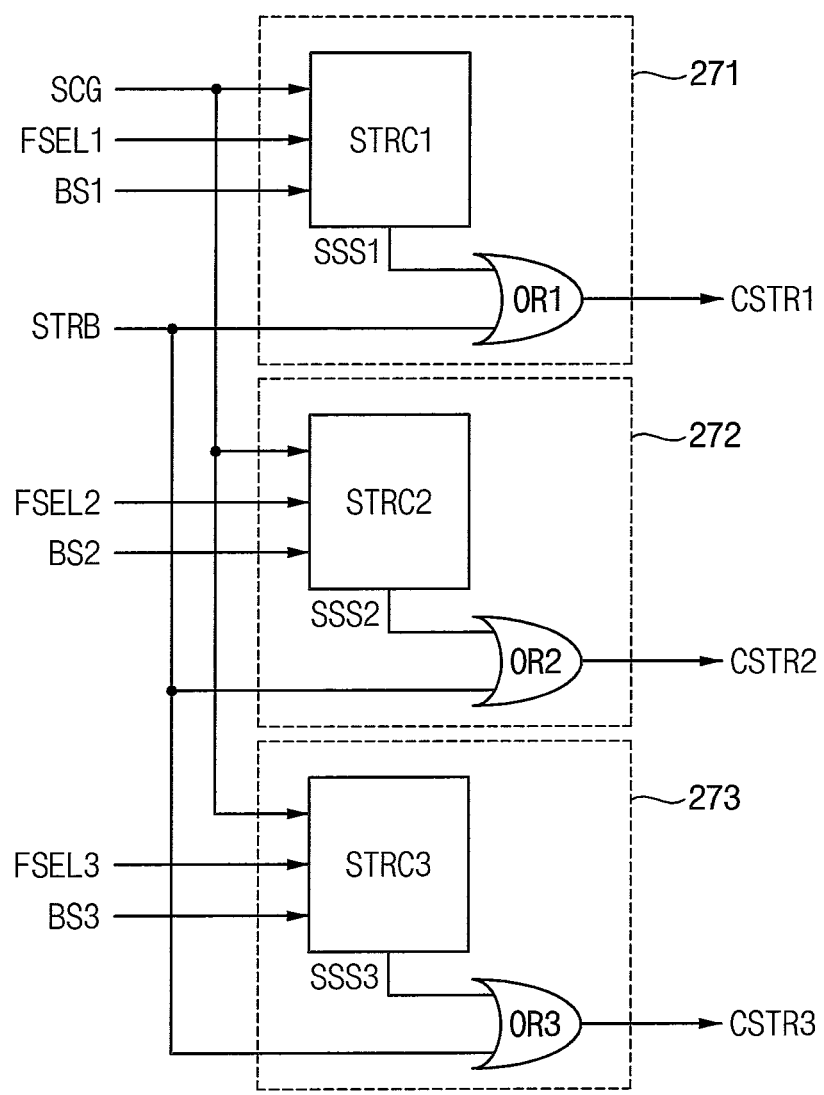
FIG. 19 is a diagram illustrating an example embodiment of a strobe control circuit included in a clock management circuit according to example embodiments.

FIG. 19 is a diagram illustrating an example embodiment of a strobe control circuit included in a clock management circuit according to example embodiments.

Referring to FIG. 19, a strobe control circuit 270 may include a plurality of core strobe generation circuits 271~273. The plurality of core strobe generation circuits 271~273 may generate a plurality of core strobe signals CSTR1~CSTR3 corresponding to a plurality of core clock signals CCK1~CCK3 based on a strobe signal STRB having the second frequency F2 and a plurality of frequency selection signals FSEL1~FSEL3, respectively.

The first core strobe generation circuit 271 may include a first strobe controller STRC1 and a first OR gate OR1. The first strobe controller STRC1 may generate a first strobe switching signal SSS1 based on the first frequency selection signal FSEL1 and the clock gating signal SCG such that the first strobe switching signal SSS1 may transition in the clock gating period tCG when the frequency of the first core clock signal CCK1 is changed. The first OR gate OR1 may generate a first core strobe signal CSTR1 by performing an OR logic operation on the first strobe switching signal SSS1 and the strobe signal STRB.

The second core strobe generation circuit 272 may include a second strobe controller STRC2 and a second OR gate OR2. The second strobe controller STRC2 may generate a second strobe switching signal SSS2 based on the second frequency selection signal FSEL2 and the clock gating signal SCG such that the second strobe switching signal SSS2 may transition in the clock gating period tCG when the frequency of the second core clock signal CCK2 is changed. The second OR gate OR2 may generate a second core strobe signal CSTR2 by performing an OR logic operation on the second strobe switching signal SSS2 and the strobe signal STRB.

The third core strobe generation circuit 273 may include a third strobe controller STRC3 and a third OR gate OR3. The third strobe controller STRC3 may generate a third strobe switching signal SSS3 based on the third frequency selection signal FSEL3 and the clock gating signal SCG such that the third strobe switching signal SSS3 may transition in the clock gating period tCG when the frequency of the third core clock signal CCK3 is changed. The third OR gate OR3 may generate a third core strobe signal CSTR3 by performing an OR logic operation on the third strobe switching signal SSS3 and the strobe signal STRB.

In some example embodiments, the strobe controller STRC1~STRC3 may generate the strobe switching signals SSS1~SSS3 by delaying the frequency selection signals FSEL1~FSEL3 such that the transition time point of the strobe switching signals SSS1~SSS3, for example, the strobe changing time point Tss may be included in the clock gating period tCG.

In some example embodiments, as will be described below with reference to FIGS. 25 through 29, the strobe controller STRC1~STRC3 may receive the above-described core busy signals BS1~BS3 and generate the strobe switching signals SSS1~SSS3 using the core busy signals BS1~BS3 such that the strobe changing time point Tss may be included in the clock gating period tCG.

Figure 20:
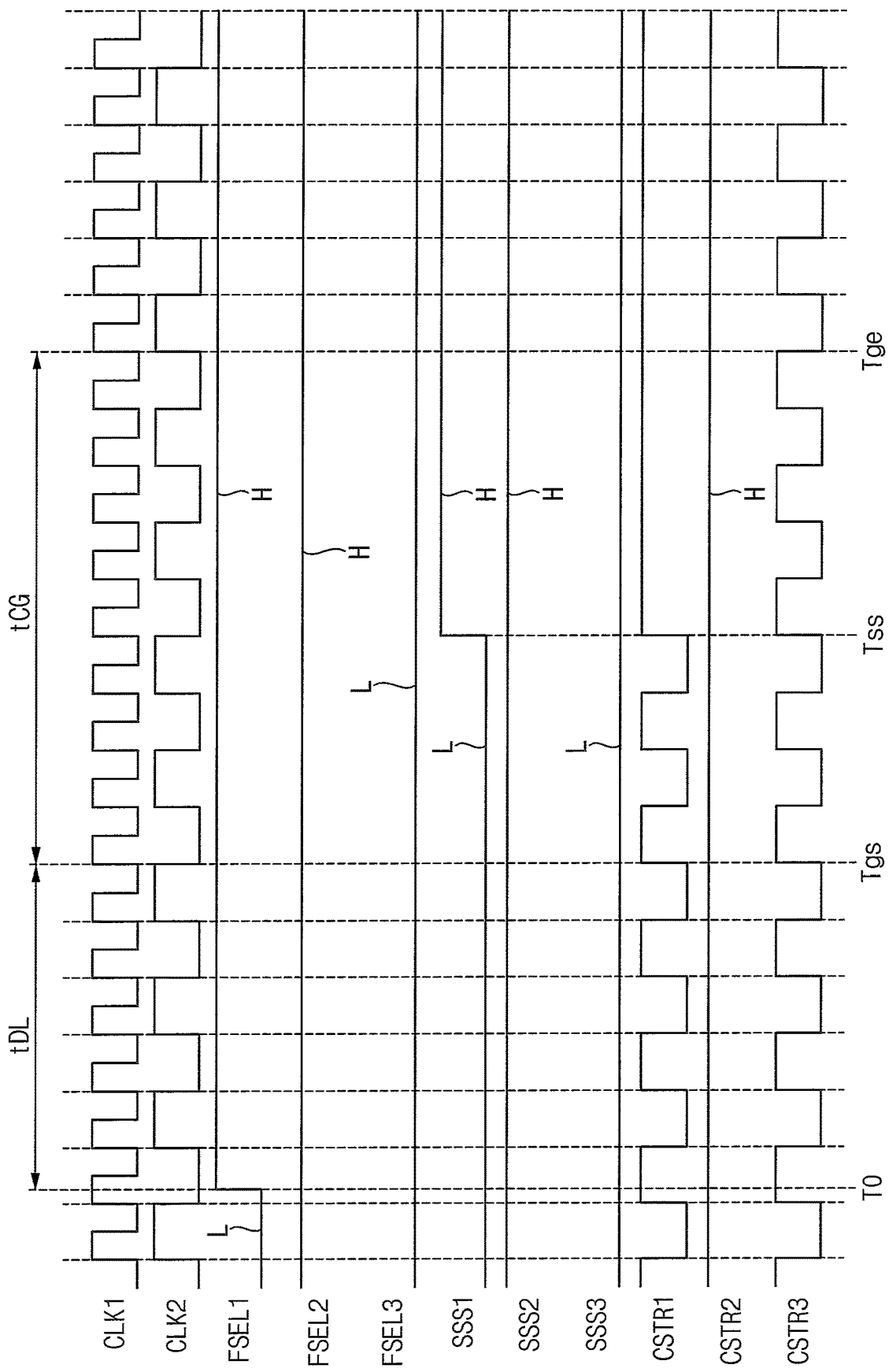
FIGS. 20 and 21 are timing diagrams illustrating operations of the strobe control circuit of FIG. 19 according to example embodiments.
Figure 21:
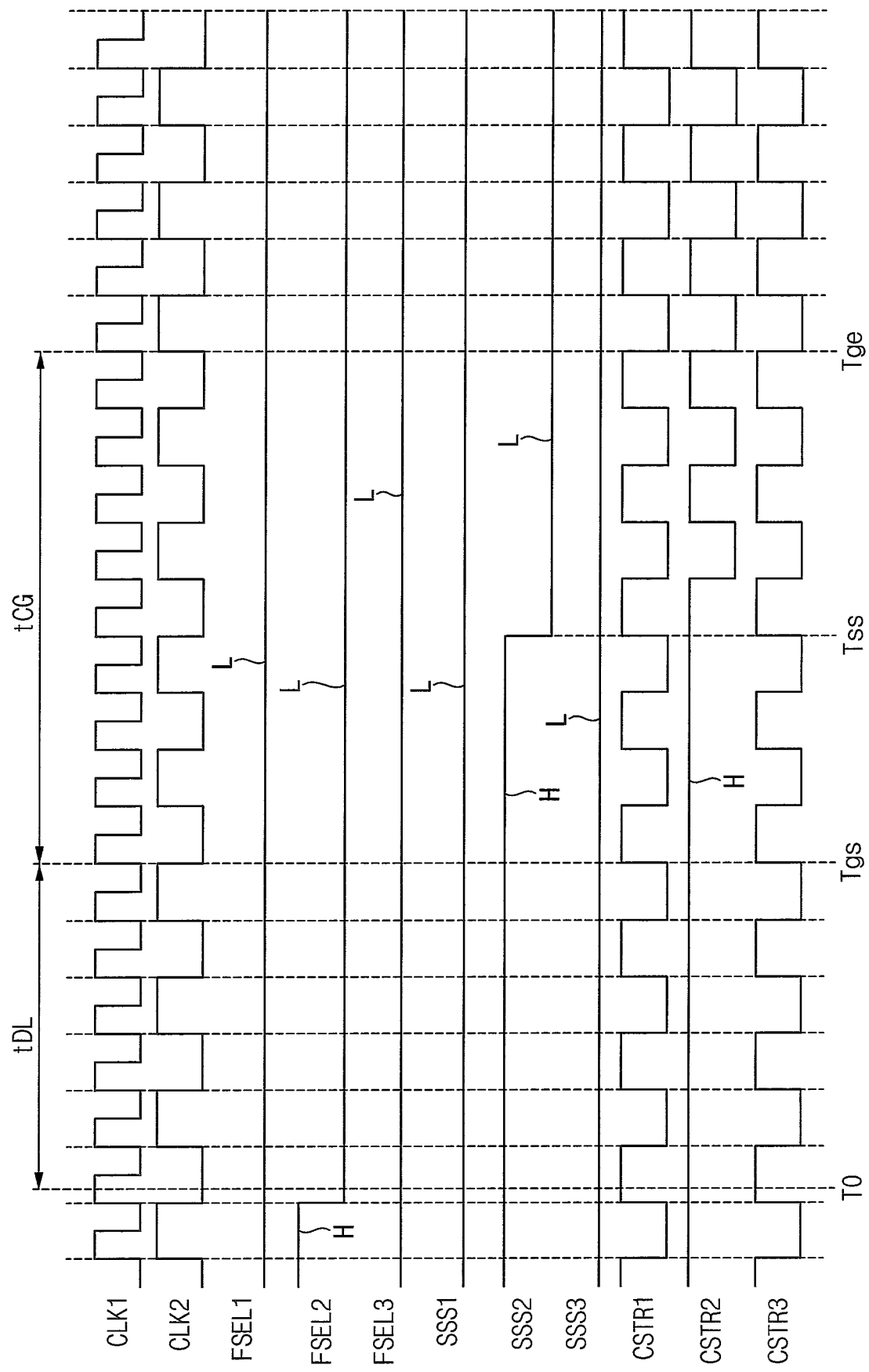

FIGS. 20 and 21 are timing diagrams illustrating operations of the strobe control circuit of FIG. 19 according to example embodiments. The frequency selection signals FSEL1~FSEL3 are the same as described with reference to FIGS. 2 and 3, and the repeated descriptions are omitted.

FIG. 20 illustrates a case that the frequency of the first core clock signal CCK1 is changed from the first frequency F1 to the second frequency F2.

Referring to FIGS. 19 and 20, the first strobe controller STRC1 may generate the first strobe switching signal SSS1 based on the first frequency selection signal FSEL1 such that the first strobe switching signal SSS1 may transition from the logic low level L to the logic high level H at the strobe changing time point Tss. The second strobe controller STRC2 may maintain the logic high level H of the second strobe switching signal SSS2 based on the second frequency selection signal FSEL2 maintaining the logic high level H, and the third strobe controller STRC3 may maintain the logic low level L of the third strobe switching signal SSS3 based on the third frequency selection signal FSEL3 maintaining the logic low level L.

As a result, the first OR gate OR1 may output the first core strobe signal CSTR1 based on transitioning of the first strobe switching signal SSS1 such that the first core strobe signal CSTR1 may correspond to the strobe signal STRB before the strobe changing time point Tss and may have the logic high level H after the strobe changing time point Tss. The second OR gate OR2 may output the second core strobe signal CSTR2 having the logic high level H based on the second strobe switching signal SSS2 having the logic high level H. The third OR gate OR3 may output the third core strobe signal CSTR3 corresponding to the strobe signal STRB based on the third strobe switching signal SSS3 having the logic low level L.

FIG. 21 illustrates a case that the frequency of the second core clock signal CCK2 is changed from the second frequency F2 to the first frequency F1.

Referring to FIGS. 19 and 21, the second strobe controller STRC2 may generate the second strobe switching signal SSS2 based on the second frequency selection signal FSEL2 such that the second strobe switching signal SSS2 may transition from the logic high level H to the logic low level L at the strobe changing time point Tss. The first and third strobe controllers STRC1 and STRC3 may maintain the logic low level L of the first and third strobe switching signals SSS1 and SSS3 based on the first and third frequency selection signals FSEL1 and FSEL3 maintaining the logic low level L.

As a result, the second OR gate OR2 may output the second core strobe signal CSTR2 based on transitioning of the second strobe switching signal SSS2 such that the second core strobe signal CSTR2 may have the logic high level H before the strobe changing time point Tss and may correspond to the strobe signal STRB after the strobe changing time point Tss. The first and third OR gates OR1 and OR3 may output the first and third core strobe signals CSTR1 and CSTR3 corresponding to the strobe signal STRB based on the first and third strobe switching signals SSS1 and SSS3 having the logic low level L.

As such, each of the plurality of core strobe signals CSTR1~CSTR3 may toggle between the logic high level H and the logic low level L when each of the plurality of core clock signals CCK1~CCK3 corresponds to the first clock signal CLK1 having the first frequency F1. In contrast, each of the plurality of core strobe signals CSTR1~CSTR3 may maintain the logic high level H when each of the plurality of core clock signals CCK1~CCK3 corresponds to the second clock signal CLK2 having the second frequency F2.

FIG. 22 is a diagram illustrating a core interface control circuit included in a multi-core processor in FIG. 1 according to example embodiments.

Referring to FIGS. 1 and 22, a core interface control circuit 310 may include a plurality of core interface clock generation circuits 311~313. In some example embodiments, the core interface clock generation circuits 311~313 may include AND gates AND1~AND3, respectively. The first core interface clock generation circuit 311 may be included in the first processor core 301, the second core interface clock generation circuit 312 may be included in the second processor core 302, and the third core interface clock generation circuit 313 may be included in the third processor core 303.

The first core interface clock generation circuit 311 may generate a first core interface clock signal CIFCK1 by performing an AND logic operation on the first core clock signal CCK1 and the first core strobe signal CSTR1. The second core interface clock generation circuit 312 may generate a second core interface clock signal CIFCK2 by performing an AND logic operation on the second core clock signal CCK2 and the second core strobe signal CSTR2. The third core interface clock generation circuit 313 may generate a third core interface clock signal CIFCK3 by performing an AND logic operation on the third core clock signal CCK3 and the third core strobe signal CSTR3.

Figure 23:
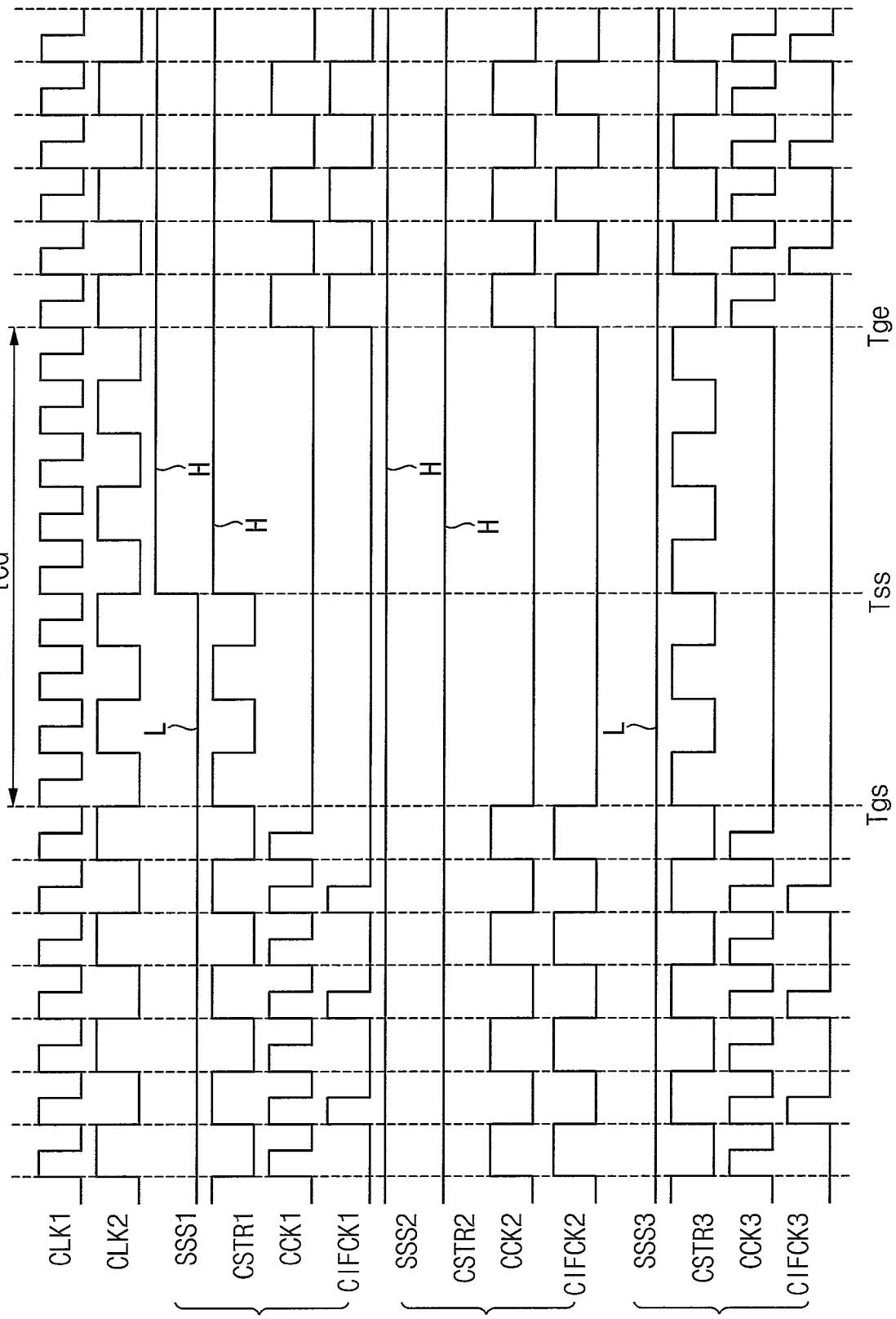
FIGS. 23 and 24 are timing diagrams illustrating operations of the core interface control circuit of FIG. 22 according to example embodiments.
Figure 24:
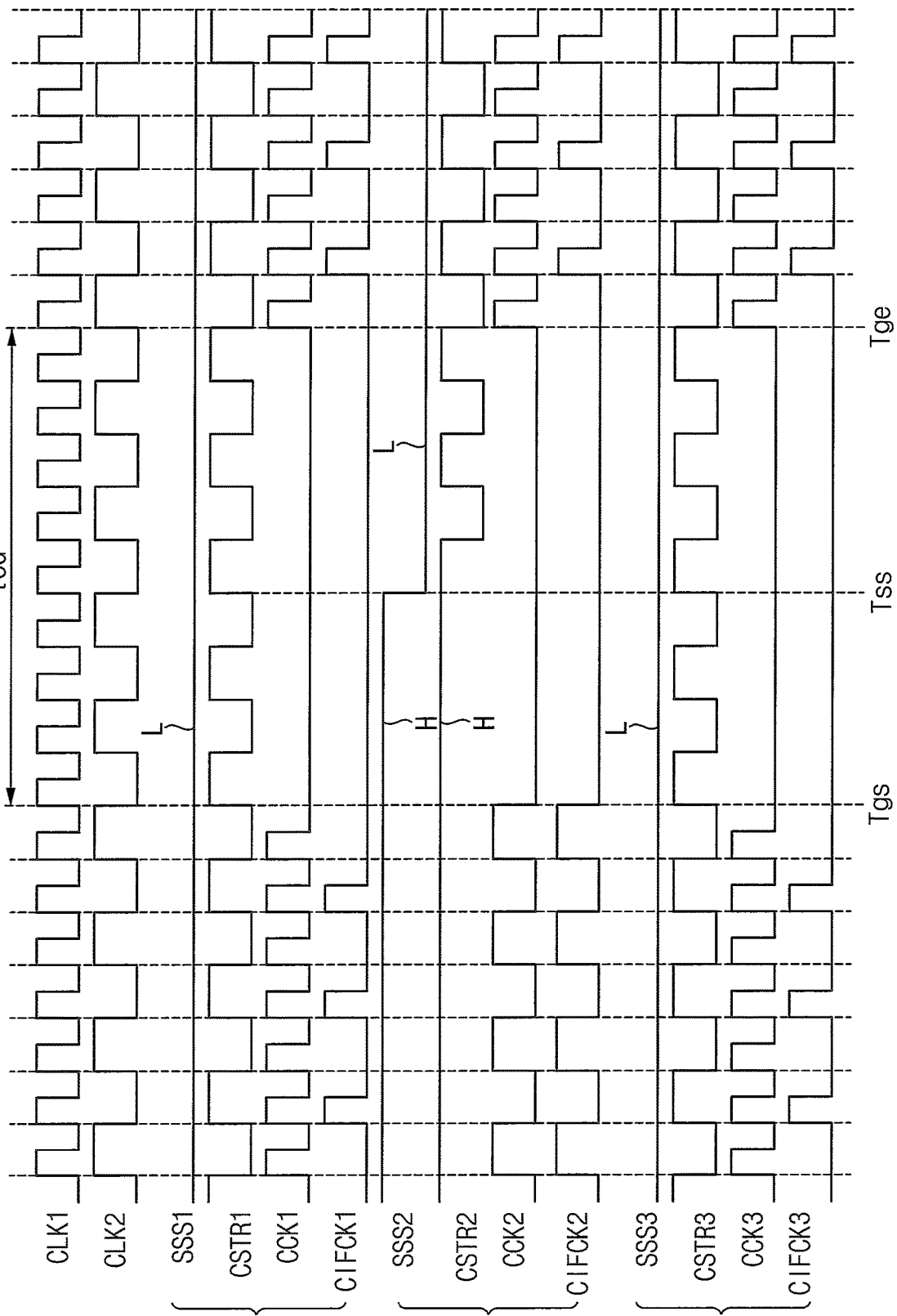

FIGS. 23 and 24 are timing diagrams illustrating operations of the core interface control circuit of FIG. 22 according to example embodiments. The strobe switching signals SSS1~SSS3 and the core strobe signals CSTR1~CSTR3 are the same as described with reference to FIGS. 20 and 21, the core clock signals CCK1~CCK3 are the same as described with reference to FIGS. 2 and 3, and the repeated descriptions are omitted.

FIG. 23 illustrates a case that the frequency of the first core clock signal CCK1 is changed from the first frequency F1 to the second frequency F2, and FIG. 24 illustrates a case that the frequency of the second core clock signal CCK2 is changed from the second frequency F2 to the first frequency F1.

Referring to FIGS. 22 through 24, each of the plurality of core interface clock generation circuits 311~313 may generate each of the plurality of core interface clock signals CIFCK1~CIFCK3 by performing an AND operation on each of the plurality of core clock signals CCK1~CCK3 and each of the plurality of core strobe signals CSTR1~CSTR3. As illustrated in FIGS. 23 and 24, each of the plurality of core interface clock signals CIFCK1~CIFCK3 may include clocks of the corresponding core clock signal having the second frequency F2 while the corresponding core strobe signal maintains the logic high level H, and may include the alternate clocks of the corresponding core clock signal having the first frequency F1 while the corresponding core strobe signal toggles with the second frequency F2.

The plurality of processor cores 301~303 may communicate with the function blocks by the second frequency F2 based on the plurality of core interface clock signals CIFCK1~CIFCK3 that toggle with the second frequency F2 regardless of the frequencies of the plurality of core clock signals CCK1~CCK3. For example, each of the plurality of processor cores 301~303 may transmit or receive data, a control signal and/or a command signal to or from the function blocks 501 and 502 of the internal circuit 500 through the interface 700 based on the plurality of core interface clock signals CIFCK1~CIFCK3 such that the function blocks 501 and 502 of the internal circuit 500 may operate with the interface clock signal IFCK synchronized with the plurality of core interface clock signals CIFCK1~CIFCK3.

Figure 25:
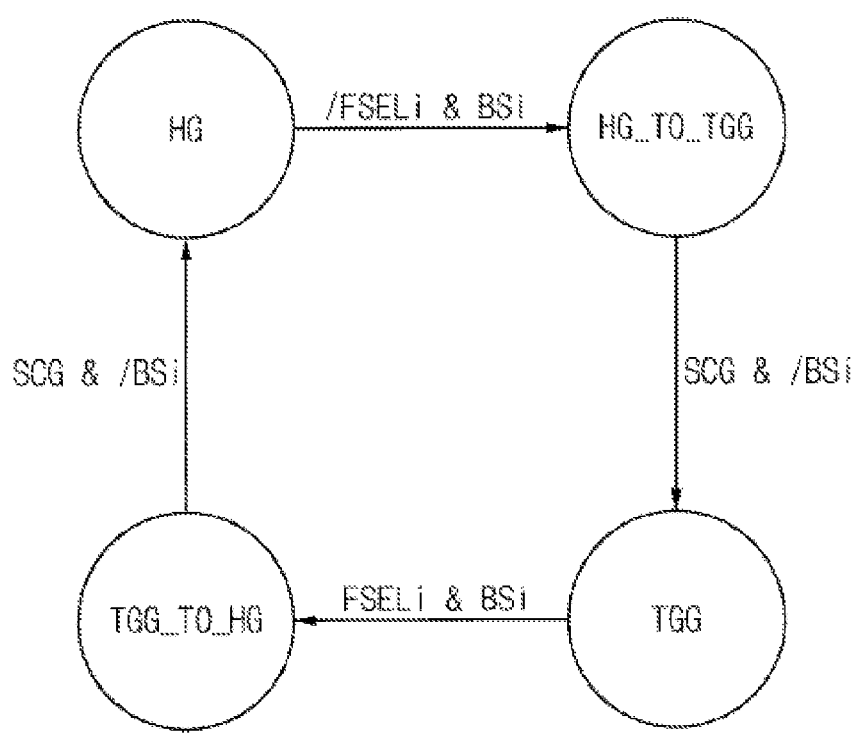
FIG. 25 is a diagram illustrating operations of a strobe controller included in core strobe generation circuits of FIG. 19 according to example embodiments.

FIG. 25 is a diagram illustrating operations of a strobe controller included in core strobe generation circuits of FIG. 19 according to example embodiments.

Each strobe controller STRCi (i=1, 2 or 3) in FIG. 19 may be implemented with a state machine as illustrated in FIG. 25. States of the strobe controller STRCi may include a toggling state TGG, a logic high state HG, a first transitioning state TGG_TO_HG and a second transitioning state HG_TO_TGG. The strobe controller STRCi may convert from the toggling state TGG to the logic high state HG via the first transitioning state TGG_TO_HG. For example, convert from the logic high state HG to the toggling state TGG via the second transitioning state HG_TO_TGG, based on the clock gating signal SCG, each frequency selection signal FSELi and each core busy signal BSi. For example, the first strobe controller STRC1 may convert from the toggling state TGG to the first transitioning state TGG_TO_HG based on the first frequency selection signal FSEL1 having the logic high level H and the first core busy signal BS1 having the logic high level H, and convert from the first transitioning state TGG_TO_HG to the logic high state HG based on the clock gating signal SCG having the logic high level H and the first core busy signal BS1 having the logic low level L. For example, the second strobe controller STRC2 may convert from the logic high state HG to the second transitioning state HG_TO_TGG based on the second frequency selection signal FSEL2 having the logic low level L and the second core busy signal BS2 having the logic high level H, and convert from the second transitioning state HG_TO_TGG to the toggling state TGG based on the clock gating signal SCG having the logic high level H and the second core busy signal BS2 having the logic low level L.

FIGS. 26 through 29 are diagrams illustrating operations of a clock management circuit according to example embodiments.

Figure 26:
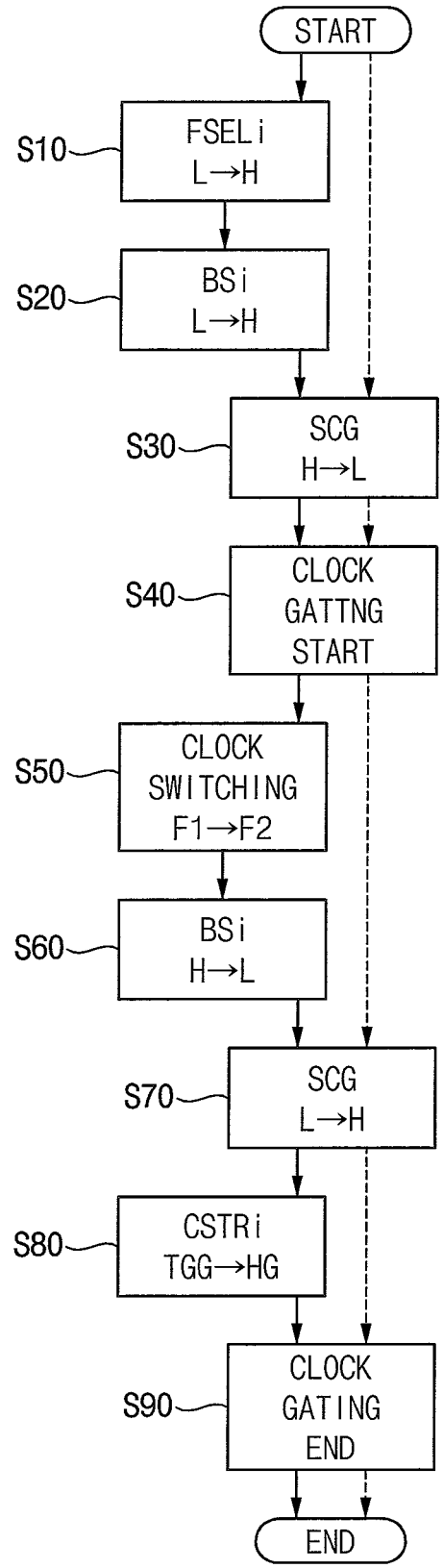
FIGS. 26 through 29 are diagrams illustrating operations of a clock management circuit according to example embodiments.

FIG. 26 is a flow chart illustrating operations of the clock management circuit when the frequency of the core clock signal CCKi is changed from the first frequency F1 to the second frequency F2. In FIG. 26, the solid arrows indicate a sequence corresponding to the core clock signal CCKi for changing the frequency, and the dotted arrows indicate a sequence corresponding to the other core clock signals for maintaining the frequency.

Referring to FIG. 26, the frequency selection signal FSELi may transition from the logic low level L to the logic high level H to change the frequency of the core clock signal CCKi (S10). The core busy signal BSi may transition from the logic low level L to the logic high level H in response to transitioning of the frequency selection signal FSELi (S20). The clock gating signal SCG may be activated from the logic high level H to the logic low level L in response to transitioning of the core busy signal BSi (S30). The clock gating with respect to all of the core clock signals and the interface clock signal may start in response to the activation of the clock gating signal SCG (S40).

The frequency of the core clock signal CCKi may be changed from the first frequency F1 to the second frequency F2 at the frequency changing time point Tcs that is included in the clock gating period tCG (S50). The core busy signal BSi may transition from the logic high level H to the logic low level L (S60), and the clock gating signal SCG may be deactivated from logic low level L to the logic high level H in response to transitioning of the core busy signal BSi (S70). The core strobe signal CSTRi may convert from the togging state TGG to the logic high state HG at the strobe changing time point Tss (S80). The clock gating with respect to all of the core clock signals and the interface clock signal may end in response to the deactivation of the clock gating signal SCG (S90).

Figure 27:
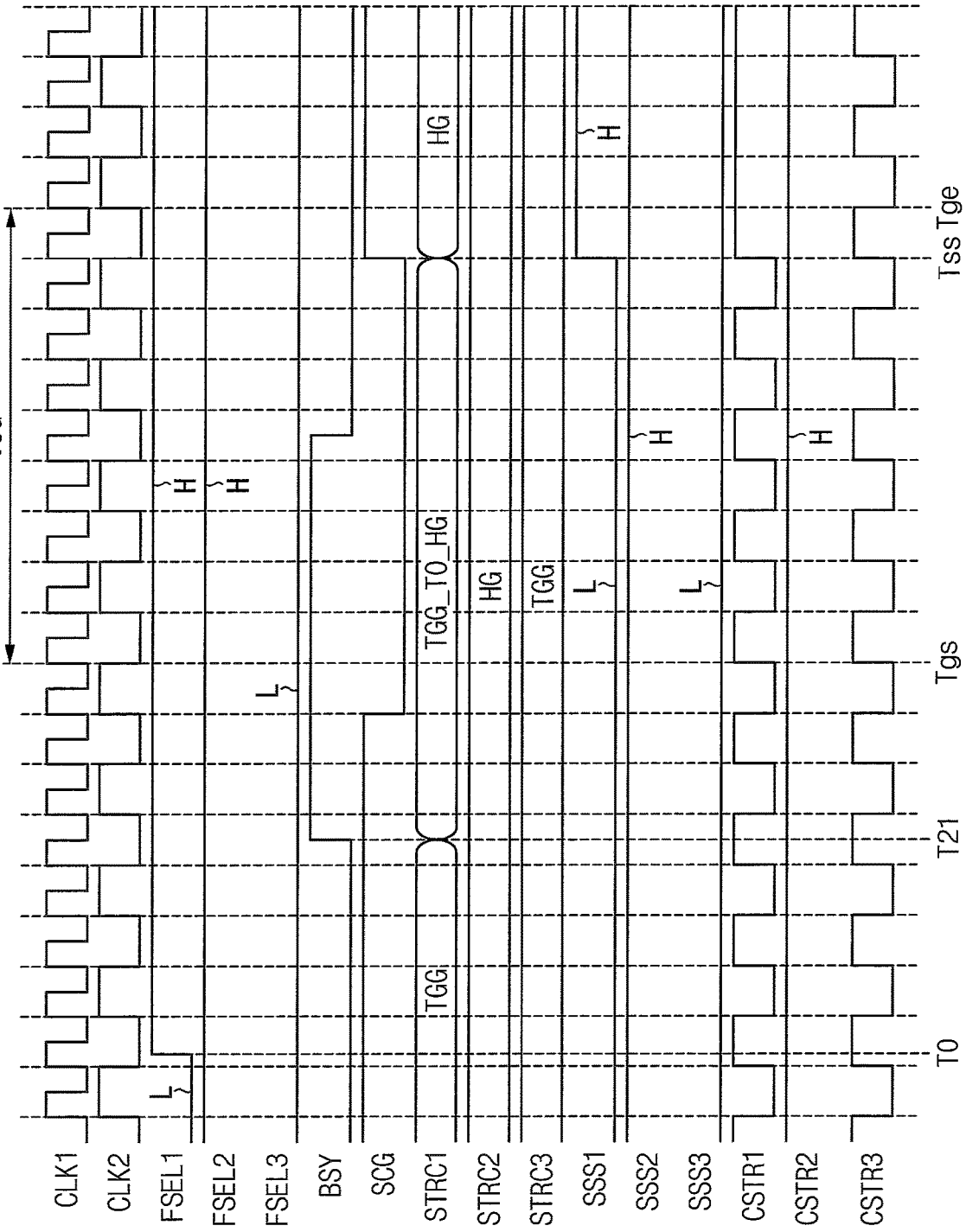

FIG. 27 is a timing diagram illustrating operations of the clock management circuit when the frequency of the first core clock signal CCK1 is changed from the first frequency F1 to the second frequency F2. The frequency selection signals FSEL1~FSEL3, the busy signal BSY, the clock gating signal SCG and the core strobe signals CSTR1~CSTR3 are the same as described above, and the repeated descriptions are omitted.

Referring to FIGS. 25 and 27, the first strobe controller STRC1 may convert from the toggling state TGG to the first transitioning state TGG_TO_HG at the time point T21 when the first frequency selection signal FSEL1 is in the logic high level H and the busy signal BSY transitions to the logic high level H. In addition, the first strobe controller STRC1 may convert from the first transitioning state TGG_TO_HG to the logic high state HG at the strobe changing time point Tss when the busy signal BSY is in the logic low level L and the clock gating signal SCG transitions to the logic high level H. The first strobe controller STRC1 may transition the first strobe switching signal SSS1 from the logic low level L to the logic high level H at the strobe changing time point Tss.

The second strobe controller STRC2 may maintain the logic high state HG and the second strobe switching signal SSS2 may maintain the logic high level H. The third strobe controller may maintain the toggling state TGG and the third strobe switching signal SSS3 may maintain the logic low level L.

Figure 28:
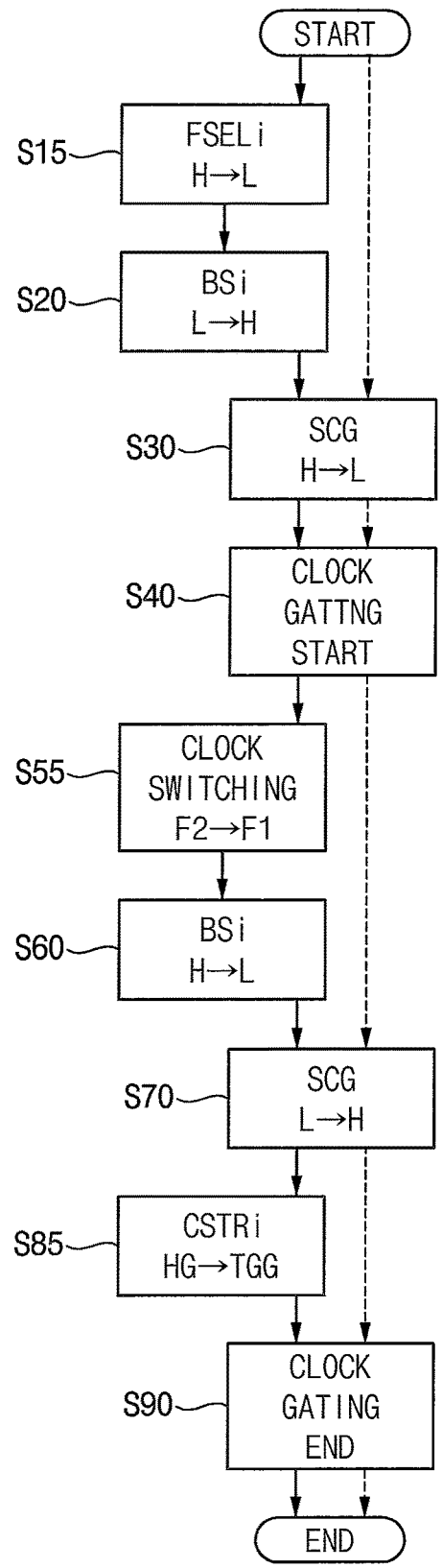

FIG. 28 is a flow chart illustrating operations of the clock management circuit when the frequency of the core clock signal CCKi is changed from the second frequency F2 to the first frequency F1. In FIG. 28, the solid arrows indicate a sequence corresponding to the core clock signal CCKi for changing the frequency, and the dotted arrows indicate a sequence corresponding to the other core clock signals for maintaining the frequency.

Referring to FIG. 28, the frequency selection signal FSELi may transition from the logic high level H to the logic low level L to change the frequency of the core clock signal CCKi (S15). The core busy signal BSi may transition from the logic low level L to the logic high level H in response to transitioning of the frequency selection signal FSELi (S20). The clock gating signal SCG may be activated from the logic high level H to the logic low level L in response to transitioning of the core busy signal BSi (S30). The clock gating with respect to all of the core clock signals and the interface clock signal may start in response to the activation of the clock gating signal SCG (S40).

The frequency of the core clock signal CCKi may be changed from the second frequency F2 to the first frequency F1 at the frequency changing time point Tcs that is included in the clock gating period tCG (S55). The core busy signal BSi may transition from the logic high level H to the logic low level L (S60), and the clock gating signal SCG may be deactivated from logic low level L to the logic high level H in response to transitioning of the core busy signal BSi (S70). The core strobe signal CSTRi may convert from the logic high state HG to the togging state TGG at the strobe changing time point Tss (S85). The clock gating with respect to all of the core clock signals and the interface clock signal may end in response to the deactivation of the clock gating signal SCG (S90).

Figure 29:
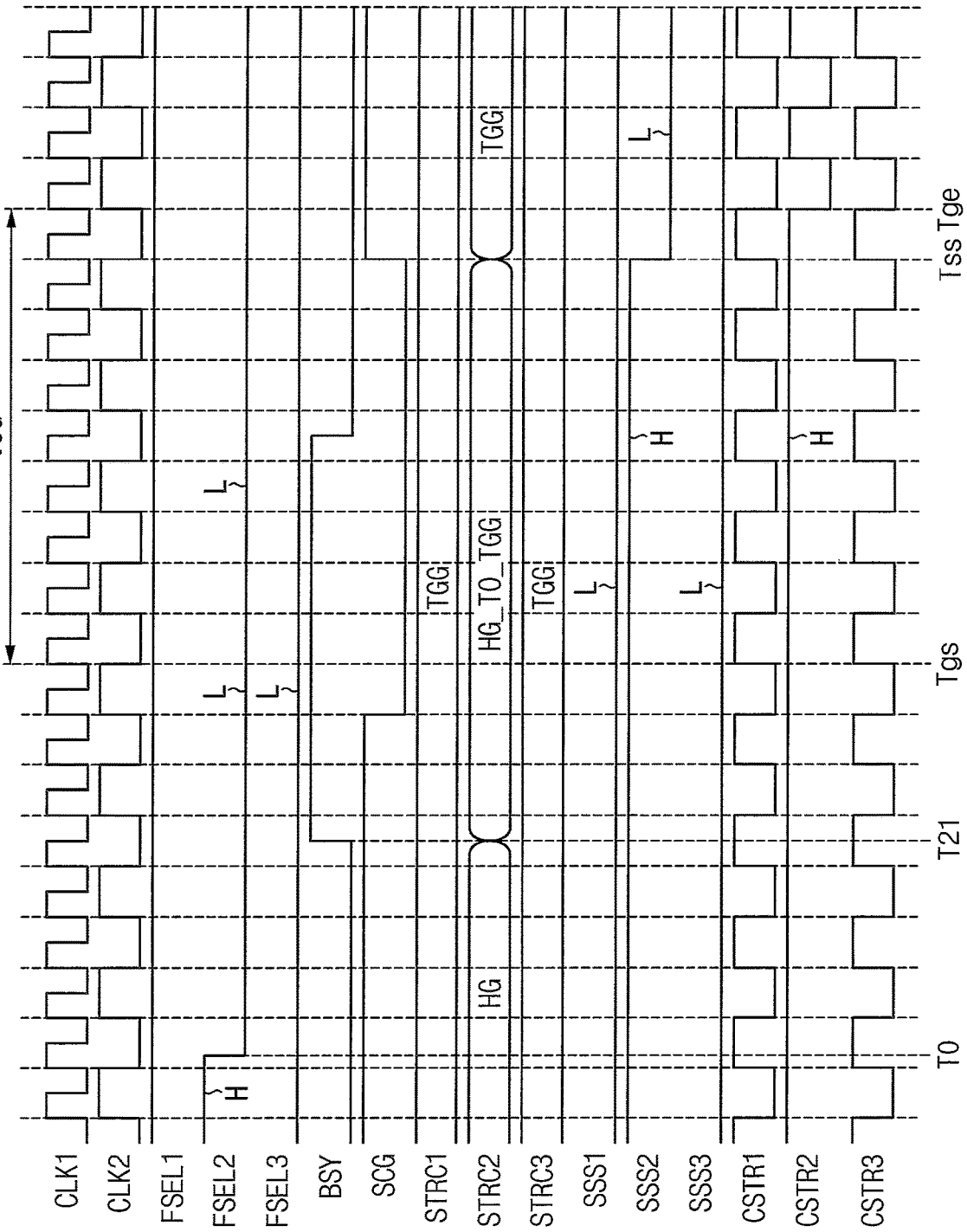

FIG. 29 is a timing diagram illustrating operations of the clock management circuit when the frequency of the second core clock signal CCK2 is changed from the second frequency F2 to the first frequency F1. The frequency selection signals FSEL1~FSEL3, the busy signal BSY, the clock gating signal SCG and the core strobe signals CSTR1~CSTR3 are the same as described above, and the repeated descriptions are omitted.

Referring to FIGS. 25 and 29, the second strobe controller STRC2 may convert from the logic high state HG to the second transitioning state HG_TO_TGG at the time point T21 when the second frequency selection signal FSEL2 is in the logic low level L and the busy signal BSY transitions to the logic high level H. In addition, the second strobe controller STRC2 may convert from the second transitioning state HG_TO_TGG to the togging state TGG at the strobe changing time point Tss when the busy signal BSY is in the logic low level L and the clock gating signal SCG transitions to the logic high level H. The second strobe controller STRC2 may transition the second strobe switching signal SSS2 from the logic high level H to the logic low level L at the strobe changing time point Tss.

The first and third strobe controllers STRC1 and STRC3 may maintain the toggling state TGG and the first and third strobe switching signals SSS1 and SSS3 may maintain the logic low level L.

Figure 30:
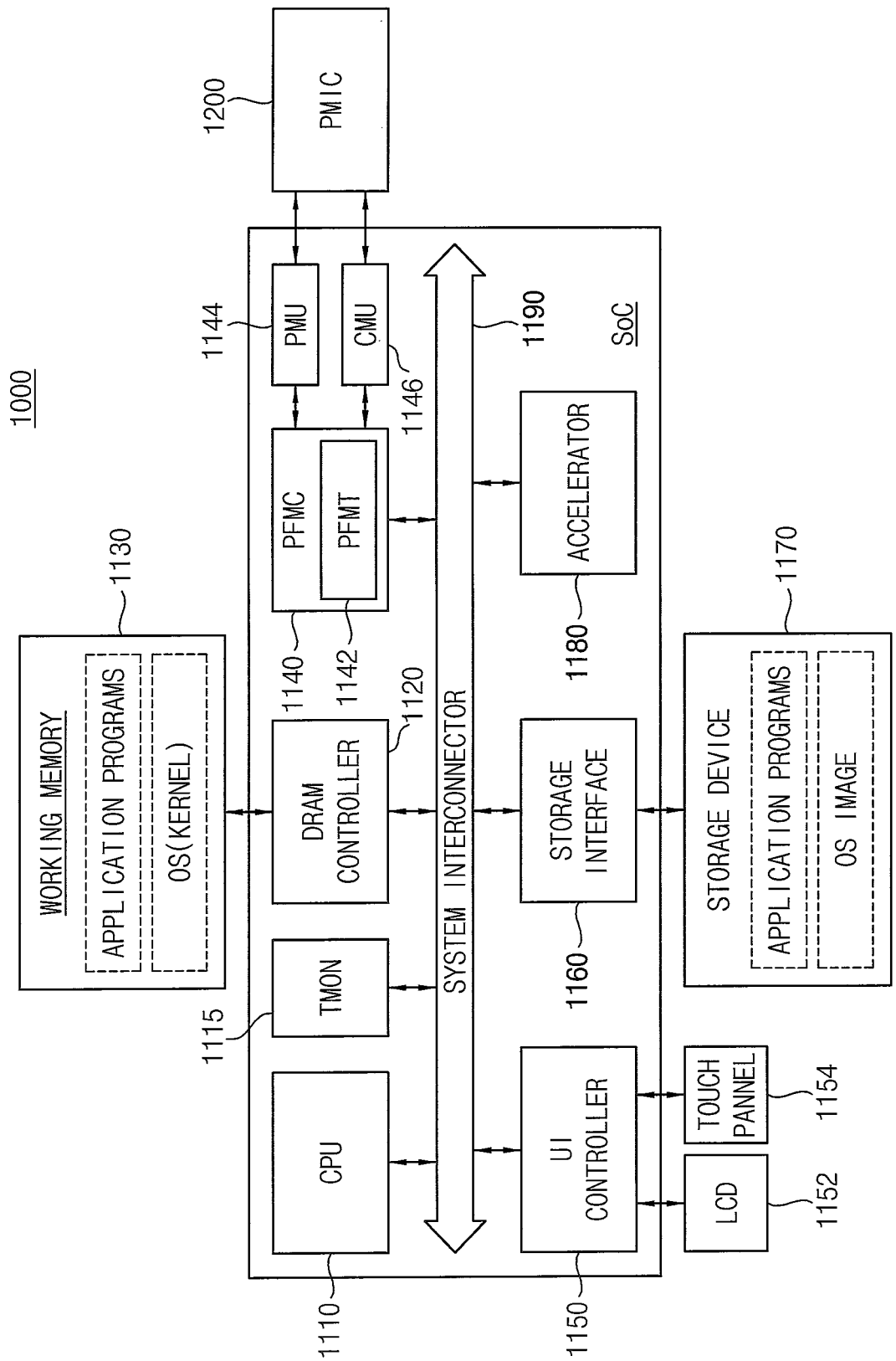
FIG. 30 is a block diagram illustrating a multi-core system according to example embodiments.

FIG. 30 is a block diagram illustrating a multi-core system according to example embodiments.

Referring to FIG. 30, a multi-core system 1000 may include a system on chip (SoC), a working memory 1130, a display device (LCD) 1152, a touch panel 1154, a storage device 1170, a power management integrated circuit (PMIC) 1200, etc. The SoC may include a central processing unit (CPU) 1110, a task monitor circuit TMON 1115, a DRAM controller 1120, a performance controller 1140, a user interface controller (UI controller) 1150, a storage interface 1160, and an accelerator 1180, a power management unit (PMU) 1144, a clock management unit (CMU) 1146, etc. It will be understood that components of the multi-core system 1000 are not limited to the components shown in FIG. 30. For example, the multi-core system 1000 may further include a hardware codec for processing image data, a security block, and the like.

The CPU 1110 executes software (for example, an application program, an operating system (OS), and device drivers) for the multi-core system 1000. The CPU 1110 may execute the operating system (OS) which may be loaded into the working memory 1130. The CPU 1110 may execute various application programs to be driven on the operating system (OS). The CPU 1110 may be provided as a homogeneous multi-core processor or a heterogeneous multi-core processor. A multi-core processor is a computing component including at least two independently drivable processors (hereinafter referred to as "cores" or "processor cores"). Each of the cores may independently read and execute program instructions. In example embodiments, the CPU 1110 may include the multi-core processor 300 of FIG. 1.

The processor cores of the processor 1100 may be grouped into a plurality of clusters that operate with an independent driving clock and an independent driving voltage. The processor cores in the same cluster may be included in a clock domain operating based on the same clock signal and/or in a power domain operating based on the same driving voltage. The driving voltage and/or the clock signal provided to each of the processor cores may be cut off or connected in units of single cores.

A kernel of the operating system (OS) may monitor the number of tasks in a task queue and the driving voltage and the driving clock of the CPU 1110 at specific time intervals to control the CPU 1110. In addition, a kernel of the operating system (OS) may control hotplug-in or hotplug-out of the CPU 1110 with reference to the monitored information. As such, as discussed in more detail below with reference to FIG. 31, a DVFS module and a frequency control module may be provided as a portion of the kennel.

The DRAM controller 1120 provides interfacing between the working memory 1130 and the system-on-chip (SoC). The DRAM controller 1120 may access the working memory 1130 according to a request of the CPU 1110 or another intellectual property (IP) block.

The operating system (OS) or basic application programs may be loaded into the working memory 1130 during a booting operation. For example, an OS image stored in the storage device 1170 is loaded into the working memory 1130 based on a booting sequence during booting of the multi-core system 1000. Overall input/output operations of the multi-core system 1000 may be supported by the operating system (OS). The working memory 1130 may be a volatile memory such as a static random access memory (SRAM) and a dynamic random access memory (DRAM) or a nonvolatile memory device such as a phase-change random-access memory (PRAM), a magnetoresistive random-access memory (MRAM), a resistive random-access memory (Re-RAM), a ferroelectric random-access memory (FRAM), and a NOR flash memory.

The performance controller 1140 may adjust operation parameters of the system-on-chip (SoC) according to a control request provided from the kernel of the operating system (OS). For example, the performance controller 1140 may adjust the level of DVFS to enhance performance of the system-on-chip (SoC). Alternatively, the performance controller 1140 may generate the frequency selection signals as described above to control the frequencies of the processor cores according to a request of the kernel. In this case, the performance controller 1140 may include a performance table 1142 to set a driving voltage and a frequency of a driving clock therein. The performance controller 1140 may control the PMU 1144 and the CMU 1146, which together form a power managing circuit, connected to the PMIC 1200 to provide the determined driving voltage and the determined driving clock to each power domain. For example, the performance controller 1140 may include the control circuit (not shown) configured to generate the frequency selection signals FSEL1~FSEL3 and the CMU 1146 may include the CMU 100 of FIG. 1.

The user interface controller 1150 controls user input and output from user interface devices. For example, the user interface controller 1150 may display a keyboard screen for inputting data to the LCD 1152 according to the control of the CPU 1110. Alternatively, the user interface controller 1150 may control the LCD 1152 to display data that a user requests. The user interface controller 1150 may decode data provided from user input means, such as a touch panel 1154, into user input data.

The storage interface 1160 accesses the storage device 1170 according to a request of the CPU 1110. For example, the storage interface 1160 provides interfacing between the system-on-chip (SoC) and the storage device 1170. For example, data processed by the CPU 1110 is stored in the storage device 1170 through the storage interface 1160. Alternatively, data stored in the storage device 1170 may be provided to the CPU 1110 through the storage interface 1160.

The storage device 1170 is provided as a storage medium of the multi-core system 1000. The storage device 1170 may store application programs, an OS image, and various types of data. The storage device 170 may be provided as a memory card (e.g., MMC, eMMC, SD, MicroSD, etc.). The storage device 170 may include a NAND-type flash memory with high-capacity storage capability. Alternatively, the storage device 1170 may include a next-generation nonvolatile memory such as PRAM, MRAM, ReRAM, and FRAM or a NOR-type flash memory.

The accelerator 1180 may be provided as a separate intellectual property (IP) component to increase processing speed of a multimedia or multimedia data. For example, the accelerator 1180 may be provided as an intellectual property (IP) component to enhance processing performance of a text, audio, still images, animation, video, two-dimensional data or three-dimensional data.

A system interconnector 1190 may be a system bus to provide an on-chip network in the system-on-chip (SoC). The system interconnector 1190 may include, for example, a data bus, an address bus, and a control bus. The data bus is a data transfer path. A memory access path to the working memory 1130 or the storage device 1170 may also be provided. The address bus provides an address exchange path between intellectual properties (IPs). The control bus provides a path along which a control signal is transmitted between intellectual properties (IPs). However, the configuration of the system interconnector 1190 is not limited to the above description and the system interconnector 190 may further include arbitration means for efficient management.

Figure 31:
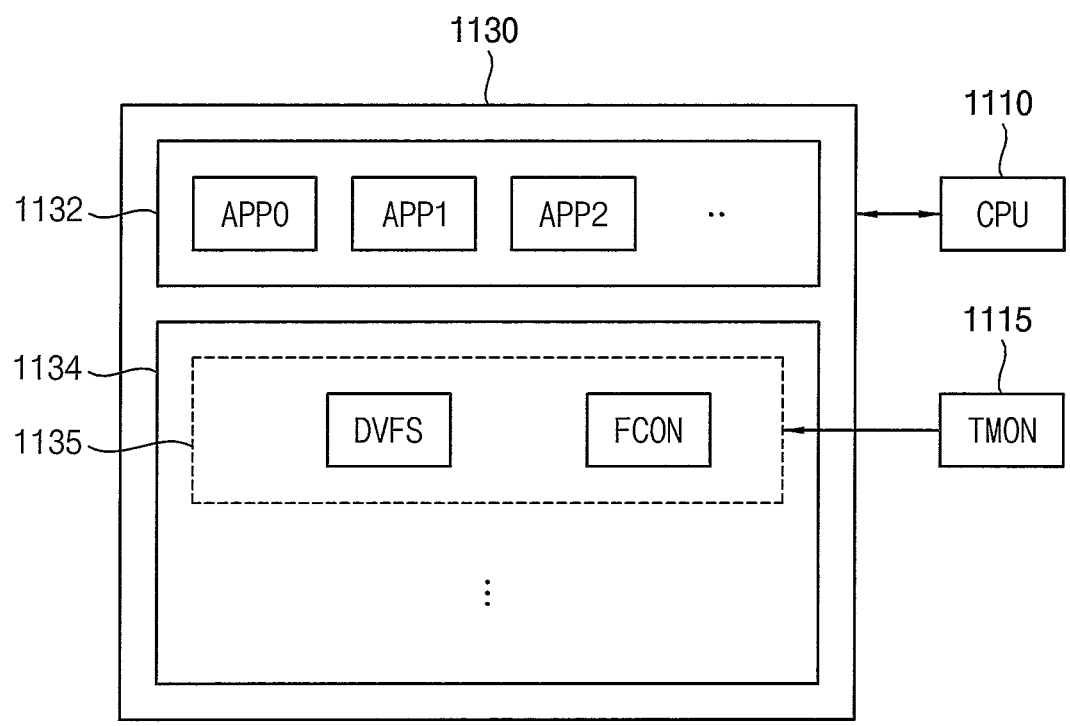
FIG. 31 is a diagram illustrating an example embodiment of a power and performance controller implemented in the multi-core system of FIG. 30.

FIG. 31 is a diagram illustrating an example embodiment of a power and performance controller implemented in the multi-core system of FIG. 30.

FIG. 31 illustrates a software structure of the multi-core system 1000 shown in FIG. 30. Referring to FIG. 31, a software layer structure of the multi-core system 1000 loaded into the working memory 1130 and driven by the CPU 1110 may be divided into an application program 1132 and a kernel 1134. The operating system (OS) may further include one or more device drivers to manage various devices such as a memory, a modem, and an image processing device.

The application program 1132 may be upper layer software driven as basic service or driven by a user's request. A plurality of application programs APP0, APP1 and APP2 may be simultaneously executed to provide various services. The application programs APP0, APP1 and APP2 may be executed by the CPU 1110 after being loaded into the working memory 1130.

The kernel 1134, as a component of the operating system (OS), performs a control operation between the application program 1132 and hardware. The kernel 1134 may include program execution, interrupt, multi-tasking, memory management, a file system, and a device driver. A frequency control module FCON may be provided as a portion of the kennel 1134.

The frequency control module FCON may be distinct from the general DVFS module. The task monitor circuit 1115 may provide information on task schedule or workload of each processor core included in the CPU 1110. The frequency control module FCON may determine an operation frequency of each processor core as the first frequency F1 or the second frequency F2 based on the information from the task monitor circuit 1115. For example, the performance controller 1140 in FIG. 30 may generate the frequency selection signals as described above to control each frequency of the processor cores in the CPU 1110 according to a request from the frequency control module FCON.

The inventive concept may be applied to a multi-core system including a plurality of processor cores. For example, the inventive concept may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, an automotive driving system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept. Therefore, all such modifications are intended to be included within the scope of the present inventive concept as defined in the appended claims.

What is claimed is:

1. A multi-core system comprising:
   a multi-core processor including a plurality of processor cores configured to operate based on a plurality of core clock signals, respectively;
   a function block configured to communicate with the multi-core processor based on an interface clock signal;
   a clock management circuit configured to:
   generate each of the plurality of core clock signals by selecting one of a first clock signal having a first frequency and a second clock signal having a second frequency different from the first frequency based on each of a plurality of frequency selection signals,
   generate the interface clock signal based on the second clock signal,
   fix a frequency of the interface signal to the second frequency regardless of the plurality of frequency selection signals, and
   change a frequency of each of the plurality of core deck signals between the frequency and the second frequency based on each of the plurality of frequency selection signals; and
   a control circuit configured to generate the plurality of frequency selection signals corresponding to the plurality of processor cores, respectively.

2. The multi-core system of claim 1, wherein the clock management circuit is further configured to:
   generate a clock gating signal that is activated to control a clock gating period when a frequency of at least one of the plurality of core clock signals is changed, and
   simultaneously deactivate the plurality of core clock signals and the interface clock signal in the clock gating period based on the clock gating signal.

3. The multi-core system of claim 1, wherein the clock management circuit is further configured to generate a plurality of core strobe signals corresponding to the plurality of core clock signals based on the plurality of frequency selection signals, respectively,
   wherein each of the plurality of processor cores is configured to communicate with the function block by the second frequency based on each of the plurality of core clock signals and each of the plurality of core strobe signals, and
   wherein the function block is configured to communicate with the plurality of processor cores by the second frequency based on the interface clock signal.

4. The multi-core system of claim 1, wherein the clock management circuit includes:
   a synchronization circuit configured to generate a clock gating signal that is activated to control a clock gating period when a frequency of at least one of the plurality of core clock signals is changed;
   a plurality of clock switching circuits configured to generate a plurality of switching clock signals by selecting one of the first clock signal and the second clock signal;
   a plurality of core clock gating circuits configured to generate the plurality of core clock signals respectively corresponding to the plurality of switching clock signals by deactivating the plurality of switching clock signals during the clock gating period based on the clock gating signal; and
   an interface clock gating circuit configured to generate the interface clock signal by deactivating the second clock signal during the clock gating period based on the clock gating signal.

5. The multi-core system of claim 4, wherein each of the plurality of clock switching circuits includes:
   a multiplexer configured to generate a switching clock signal of the plurality of switching clock signals by selecting one of the first clock signal and the second clock signal based on a clock switching signal that transitions at a clock changing time point.

6. The multi-core system of claim 4, wherein each of the plurality of clock switching circuits includes:
   a multiplexer configured to generate a selection clock signal by selecting one of the first clock signal and the second clock signal based on a clock switching signal that transitions at a clock changing time point; and
   a glitch free circuit configured to generate a switching clock signal of the plurality of switching clock signals by removing a glitch at the clock changing time point from the selection clock signal.

7. The multi-core system of claim 4, wherein the synchronization circuit includes:
- an OR gate configured to generate a busy signal by performing an OR logic operation on a plurality of core busy signals where each of the plurality of core busy signal is activated when a frequency of each of the plurality of core clock signals is changed;
- a first flip-flop circuit configured to generate a first enable signal by synchronizing the busy signal with the second clock signal;
- a second flip-flop circuit configured to generate a second enable signal by synchronizing the first enable signal with the first clock signal; and
- a multiplexer configured to generate the clock gating signal by selecting one of the first enable signal and the second enable signal based on the busy signal.

8. The multi-core system of claim 7, wherein the synchronization circuit is configured to:
- activate the clock gating signal based on transitioning of the first enable signal, and
- deactivate the clock gating signal based on transitioning of the second enable signal.

9. The multi-core system of claim 4, wherein each of the plurality of core clock gating circuits includes:
- a latch circuit configured to generate a mask signal based on the clock gating signal and a switching clock signal of the plurality of switching clock signals; and
- an AND gate configured to generate a core clock signal of the plurality of core clock signals by performing an AND operation on the mask signal and the switching clock signal.

10. The multi-core system of claim 4, wherein the interface clock gating circuit includes:
- a latch circuit configured to generate a mask signal based on the clock gating signal and the second clock signal; and
- an AND gate configured to generate the interface clock signal by performing an AND operation on the mask signal and the second clock signal.

11. The multi-core system of claim 4, wherein the clock management circuit further includes:
- a plurality of core strobe generation circuits configured to generate a plurality of core strobe signals corresponding to the plurality of core clock signals based on a strobe signal having the second frequency and the plurality of frequency selection signals, respectively.

12. The multi-core system of claim 11, wherein each of the plurality of core strobe generation circuits includes:
- a strobe controller configured to generate a strobe switching signal based on a frequency selection signal of the plurality of frequency selection signals such that the strobe switching signal transitions in the clock gating period when a frequency of a core clock signal of the plurality of core clock signals is changed; and
- an OR gate configured to generate a core strobe signal of the plurality of core strobe signals by performing an OR logic operation on the strobe switching signal and the strobe signal.

13. The multi-core system of claim 11, wherein each of the plurality of core strobe generation circuits is configured to generate a core strobe signal of the plurality of core strobe signals:
- toggling between a logic high level and a logic low level when a core clock signal of the plurality of core clock signals corresponds to the first clock signal, and
- maintaining the logic high level when the core clock signal corresponds to the second clock signal.

14. The multi-core system of claim 11, wherein each of the plurality of processor cores is configured to;
- generate a core interface clock signal by performing an AND operation on a core clock signal of the plurality of core clock signals and a core strobe signal of the plurality of core strobe signals, and
- communicate with the function block by the second frequency based on the core interface clock signal.

15. The multi-core system of claim 4, wherein the clock management circuit further includes:
- a clock divider configured to generate the second clock signal having the second frequency by dividing the first frequency of the first clock signal and configured to commonly provide the second clock signal to the plurality of clock switching circuits and the interface clock gating circuit.

16. A multi-core system comprising:
- a multi-core processor including a first processor core configured to operate based on a first core clock signal and a second processor core configured to operate based on a second core clock signal;
- a function block configured to communicate with the multi-core processor based on an interface clock signal; and
- a clock management circuit configured to:
- generate the first core clock signal by selecting one of a first clock signal having a first frequency and a second clock signal having a second frequency different from the first frequency based on a first frequency selection signal,
- generate the second core clock signal by selecting one of the first clock signal and the second clock signal based on a second frequency selection signal,
- generate the interface clock signal based on the second clock signal, and
- when at least one of a frequency of the first core clock signal and a frequency of the second core clock signal is changed, simultaneously deactivate the first core clock signal, the second core clock signal and the interface clock signal in a clock gating period.

17. The multi-core system of claim 16, wherein the clock management circuit is further configured to:
- change a frequency of the first core clock signal between the first frequency and the second frequency based on the first frequency selection signal regardless of a frequency of the second core clock signal, and
- change the frequency of the second core clock signal between the first frequency and the second frequency based on the second frequency selection signal regardless of the frequency of the first core clock signal.

18. The multi-core system of claim 16, wherein the clock management circuit is configured to generate a first core strobe signal and a second core strobe signal corresponding to the first core clock signal and the second core clock signal based on the first frequency selection signal and the second frequency selection signal, respectively,
- wherein the first processor core is configured to communicate with the function block by the second frequency based on the first core clock signal and the first core strobe signal,
- wherein the second processor core is configured to communicate with the function block by the second frequency based on the second core clock signal and the second core strobe signal, and wherein the function block is configured to communicate with the first processor core and the second processor core by the second frequency based on the interface clock signal.

19. A clock management circuit comprising:
a synchronization circuit configured to generate a clock gating signal that is activated to control a clock gating period when a frequency of at least one of a plurality of core clock signals provided to a plurality of processor cores of a multi-core system is changed;
a plurality of clock switching circuits configured to a plurality of switching clock signals by selecting one of a first clock signal having a first frequency and a second clock signal having a second frequency different from the first frequency;
a plurality of core clock gating circuits configured to generate the plurality of core clock signals respectively corresponding to the plurality of switching clock signals by deactivating the plurality of switching clock signals in the clock gating period based on the clock gating signal; and
an interface clock gating circuit configured to generate an interface clock signal provided to a function block of the multi-core system by deactivating the second clock signal in the clock gating period based on the clock gating signal.

* * * * *